(12) United States Patent
Houweling et al.

(10) Patent No.: US 10,712,656 B2
(45) Date of Patent: Jul. 14, 2020

(54) METHOD FOR MANUFACTURING A MEMBRANE ASSEMBLY

(71) Applicant: ASML NETHERLANDS B.V., Veldhoven (NL)

(72) Inventors: Zomer Silvester Houweling, Utrecht (NL); Eric Willem Felix Casimiri, Veldhoven (NL); Tamara Druzhinina, Eindhoven (NL); Paul Janssen, Eindhoven (NL); Michael Alfred Josephus Kuijken, Son en Breugel (NL); Martinus Hendrikus Antonius Leenders, Rhoon (NL); Sicco Oosterhoff, Nuenen (NL); Mária Péter, Eindhoven (NL); Willem Joan Van Der Zande, Bussum (NL); Pieter-Jan Van Zwol, Eindhoven (NL); Beatrijs Louise Marie-Joseph Katrien Verbrugge, Kasterlee (BE); Johannes Petrus Martinus Bernardus Vermeulen, Leende (NL); David Ferdinand Vles, Eindhoven (NL); Willem-Pieter Voorthuijzen, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 240 days.

(21) Appl. No.: 15/752,302

(22) PCT Filed: Aug. 26, 2016

(86) PCT No.: PCT/EP2016/070161
§ 371 (c)(1),
(2) Date: Feb. 13, 2018

(87) PCT Pub. No.: WO2017/036944
PCT Pub. Date: Mar. 9, 2017

(65) Prior Publication Data
US 2018/0239240 A1 Aug. 23, 2018

(30) Foreign Application Priority Data
Sep. 2, 2015 (EP) .................................... 15183437

(51) Int. Cl.
*G03F 1/62* (2012.01)
*G03F 7/20* (2006.01)

(52) U.S. Cl.
CPC ............ *G03F 1/62* (2013.01); *G03F 7/70983* (2013.01)

(58) Field of Classification Search
CPC ........................................................ G03F 1/62
USPC ............................................................ 430/5
See application file for complete search history.

(56) References Cited

U.S. PATENT DOCUMENTS

| 6,623,893 B1 | 9/2003 | Levinson et al. |
| 2002/0181092 A1 | 12/2002 | Wang |
| 2010/0248449 A1 | 9/2010 | Hildreth et al. |
| 2011/0207030 A1 | 8/2011 | Shirasaki et al. |
| 2013/0319466 A1 | 12/2013 | Mizoguchi et al. |
| 2015/0168824 A1 | 6/2015 | Sun et al. |
| 2015/0293441 A1 | 10/2015 | Shishido et al. |

FOREIGN PATENT DOCUMENTS

| EP | 2423747 | 2/2012 |
| WO | 2015/160185 | 10/2015 |
| WO | 2015/166927 | 11/2015 |
| WO | 2015/174412 | 11/2015 |
| WO | 2015/182483 | 12/2015 |

OTHER PUBLICATIONS

International Search Report and Written Opinion dated Nov. 30, 2016 in corresponding International Patent Application No. PCT/EP2016/070161.
Williams, Kirt R. et al., "Etch Rates for Micromachining Processing", Journal of Microelectromechanical Systems, vol. 5, No. 4, pp. 256-269 (1996).

*Primary Examiner* — Christopher G Young
(74) *Attorney, Agent, or Firm* — Pillsbury Winthrop Shaw Pittman LLP

(57) ABSTRACT

A method for manufacturing a membrane assembly for EUV lithography, the method comprising: providing a stack comprising a planar substrate and at least one membrane layer, wherein the planar substrate comprises an inner region and a border region around the inner region; positioning the stack on a support such that the inner region of the planar substrate is exposed; and selectively removing the inner region of the planar substrate using a non-liquid etchant, such that the membrane assembly comprises: a membrane formed from the at least one membrane layer; and a border holding the membrane, the border formed from the border region of the planar substrate.

21 Claims, 14 Drawing Sheets

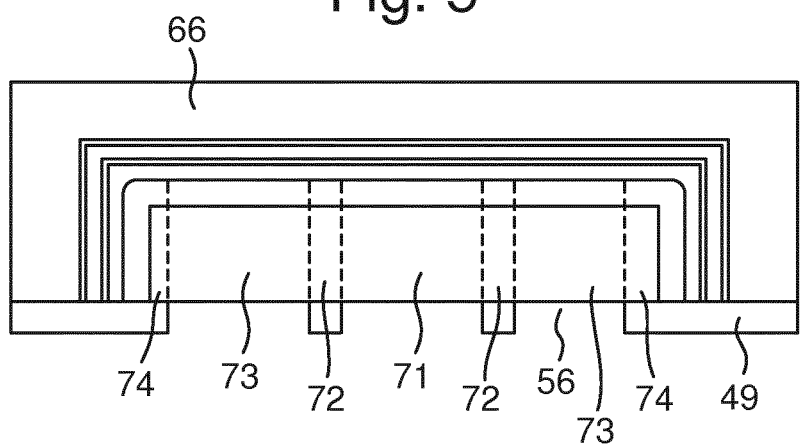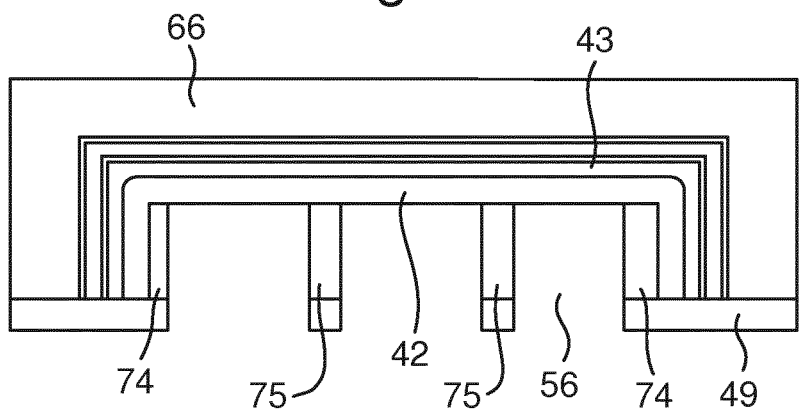

METHOD FOR MANUFACTURING A MEMBRANE ASSEMBLY

CROSS-REFERENCE TO RELATED APPLICATIONS

This application is the U.S. national phase entry of PCT patent application no. PCT/EP2016/070161, which was filed on Aug. 26, 2016, which claims the benefit of priority of European Patent application no. 15183437.1, which was filed on Sep. 2, 2015, and which is incorporated herein in its entirety by reference.

FIELD

The present invention relates to a method for manufacturing a membrane assembly, and to a membrane assembly.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process-dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

A lithographic apparatus includes a patterning device (e.g., a mask or a reticle). Radiation is provided through or reflected off the patterning device to form an image on a substrate. A membrane assembly may be provided to protect the patterning device from airborne particles and other forms of contamination. The membrane assembly for protecting the patterning device may be called a pellicle. Contamination on the surface of the patterning device can cause manufacturing defects on the substrate. The membrane assembly may comprise a border and a membrane stretched across the border. It is difficult to manufacture the membrane assembly without the membrane assembly being deformed in the process, for example because of the thinness of the membrane.

It is also difficult to manufacture the membrane assembly without the membrane assembly being damaged or contaminated in the process. For example, the membrane may be undesirably oxidized or have unwanted contaminant particles deposited on the membrane during the process of manufacturing the membrane assembly.

It is desirable to reduce the possibility of a membrane assembly such as a pellicle being deformed, damaged or contaminated during its manufacture.

SUMMARY OF THE INVENTION

According to an aspect of the invention, there is provided a method for manufacturing a membrane assembly for EUV lithography, the method comprising: providing a stack comprising a planar substrate and at least one membrane layer, wherein the planar substrate comprises an inner region, a border region around the inner region, a bridge region around the border region and an edge region around the bridge region; forming a bridge groove through the at least one membrane layer adjacent the bridge region of the planar substrate; selectively removing the inner region and the bridge region of the planar substrate, such that the membrane assembly comprises: a membrane formed from the at least one membrane layer; a border holding the membrane, the border formed from the border region of the planar substrate; an edge section around the border, the edge section formed from the edge region of the planar substrate; and a bridge between the border and the edge section, the bridge formed by the at least one membrane layer; and separating the edge section from the border such that the at least one membrane layer adjacent the edge section is separated from the membrane by the bridge groove.

According to an aspect of the invention, there is provided a method for manufacturing a membrane assembly for EUV lithography, the method comprising: providing a stack comprising a planar substrate and at least one membrane layer, wherein the planar substrate comprises an inner region and a border region around the inner region; positioning the stack on a support such that the inner region of the planar substrate is exposed; and selectively removing the inner region of the planar substrate using a non-liquid etchant, such that the membrane assembly comprises: a membrane formed from the at least one membrane layer; and a border holding the membrane, the border formed from the border region of the planar substrate.

According to an aspect of the invention, there is provided a method for manufacturing a membrane assembly for EUV lithography, the method comprising: providing a stack comprising a planar substrate and at least one membrane layer, wherein the planar substrate comprises an inner region and a border region around the inner region; and selectively removing the inner region of the planar substrate, such that the membrane assembly comprises: a membrane formed from the at least one membrane layer; and a border holding the membrane, the border formed from the border region of the planar substrate; wherein the stack is provided with a mechanical protection material configured to mechanically protect the border region during the step of selectively removing the inner region of the planar substrate; and removing the mechanical protection material using a fluoride etchant.

According to an aspect of the invention, there is provided a membrane assembly for EUV lithography, the membrane assembly comprising a membrane formed from at least one membrane layer comprising silicon and a border holding the membrane, wherein: edges of the at least one membrane layer in the stack are rounded or chamfered; and/or part of the at least one membrane layer extends radially outwardly of the border; and/or a passivation coating is applied to the edges of the at least one membrane layer; and/or the edges of the at least one membrane layer are oxidized or nitride.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 5 to 8 schematically depict stages of a method for manufacturing a pellicle according to an embodiment of the invention;

Figure 1:
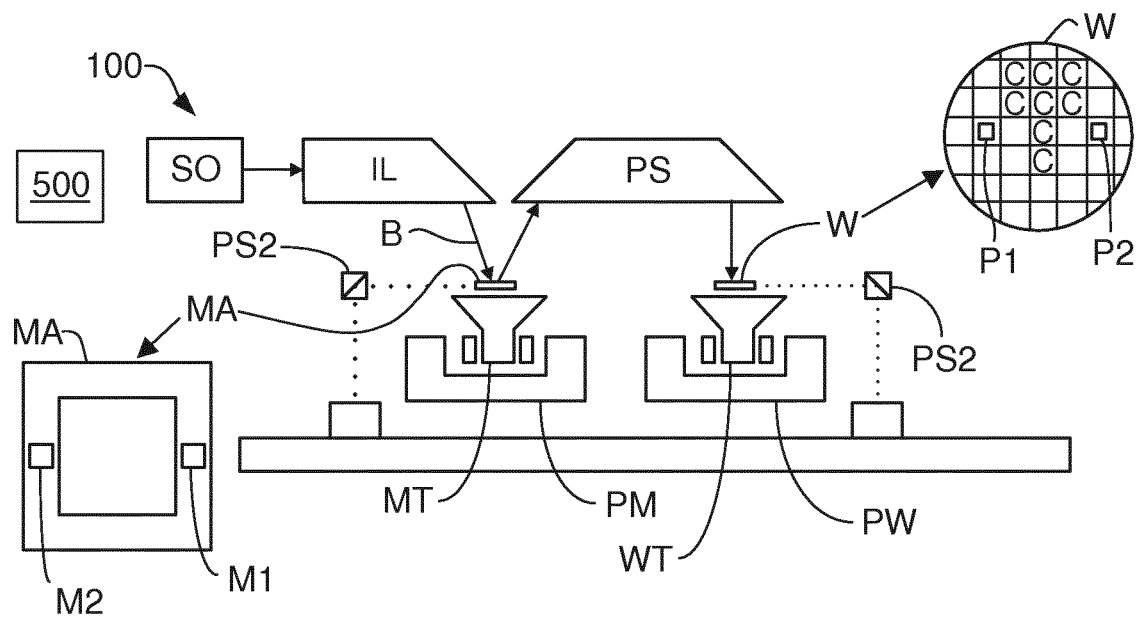
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

FIG. 1 schematically depicts a lithographic apparatus 100 including a source collector module SO according to one embodiment of the invention. The apparatus 100 comprises:

an illumination system (or illuminator) IL configured to condition a radiation beam B (e.g., EUV radiation).

a support structure (e.g., a mask table) MT constructed to support a patterning device (e.g., a mask or a reticle) MA and connected to a first positioner PM configured to accurately position the patterning device;

a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" should be broadly interpreted as referring to any device that can be used to impart a radiation beam B with a pattern in its cross-section such as to create a pattern in a target portion C of the substrate W. The pattern imparted to the radiation beam B may correspond to a particular functional layer in a device being created in the target portion C, such as an integrated circuit.

The patterning device MA may be transmissive or reflective. Examples of patterning devices include masks, programmable mirror arrays, and programmable liquid-crystal display (LCD) panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The projection system PS, like the illumination system IL, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the lithographic apparatus 100 is of a reflective type (e.g., employing a reflective mask).

The lithographic apparatus 100 may be of a type having two (dual stage) or more substrate tables WT (and/or two or more support structures MT). In such a "multiple stage" lithographic apparatus the additional substrate tables WT (and/or the additional support structures MT) may be used in parallel, or preparatory steps may be carried out on one or more substrate tables WT (and/or one or more support structures MT) while one or more other substrate tables WT (and/or one or more other support structures MT) are being used for exposure.

Referring to FIG. 1, the illumination system IL receives an extreme ultraviolet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module SO may be separate entities, for example when a $CO_2$ laser is used to provide the laser beam for fuel excitation.

In such cases, the laser is not considered to form part of the lithographic apparatus 100 and the radiation beam B is passed from the laser to the source collector module SO with the aid of a beam delivery system comprising, for example, suitable directing mirrors and/or a beam expander. In other cases the source may be an integral part of the source collector module SO, for example when the source is a discharge produced plasma EUV generator, often termed as a DPP source.

The illumination system IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as facetted field and pupil mirror devices. The illumination system IL may be used to condition the radiation beam B, to have a desired uniformity and intensity distribution in its cross-section.

The radiation beam B is incident on the patterning device (e.g., mask) MA, which is held on the support structure (e.g., mask table) MT, and is patterned by the patterning device MA. After being reflected from the patterning device (e.g., mask) MA, the radiation beam B passes through the projection system PS, which focuses the radiation beam B onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. The patterning device (e.g., mask) MA and the substrate W may be aligned using mask alignment marks M1, M2 and substrate alignment marks P1, P2.

A controller 500 controls the overall operations of the lithographic apparatus 100 and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus 100. It will be appreciated that a one-to-one relationship between controlling computer and lithographic apparatus 100 is not necessary. In an embodiment of the invention one computer can control multiple lithographic apparatuses 100. In an embodiment of the invention, multiple networked computers can be used to control one lithographic apparatus 100. The controller 500 may also be configured to control one or more associated process devices and substrate handling devices in a lithocell or cluster of which the lithographic apparatus 100 forms a part. The controller 500 can also be configured to be subordinate to a supervisory control system of a lithocell or cluster and/or an overall control system of a fab.

Figure 2:
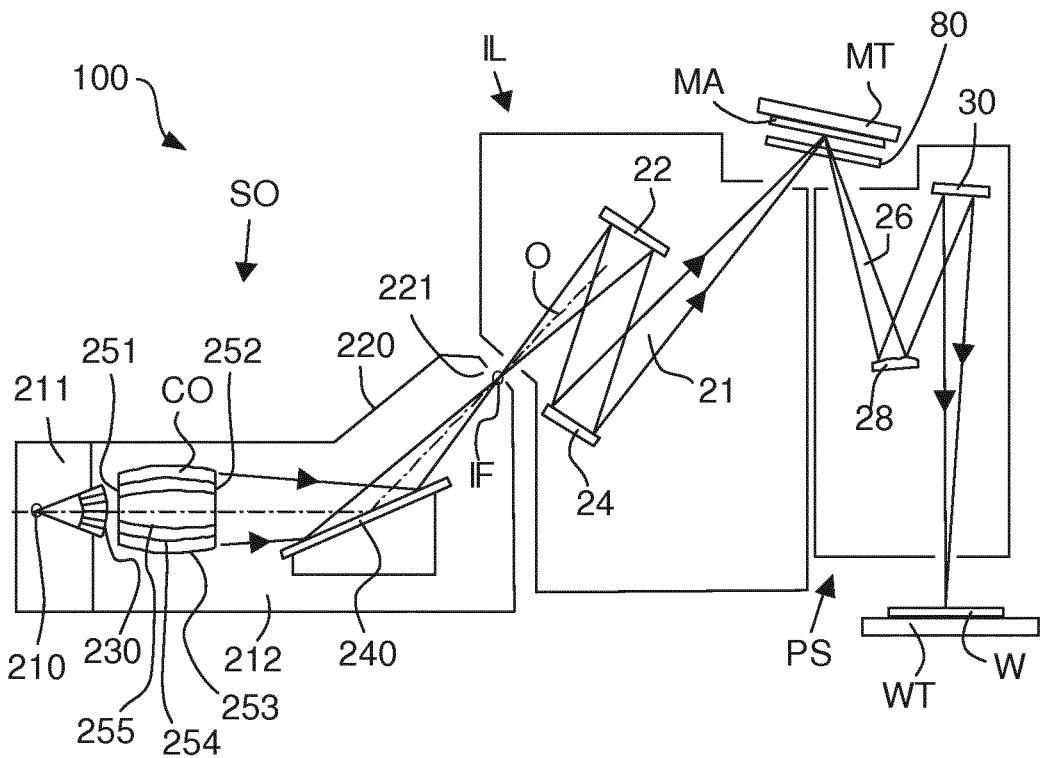
FIG. 2 is a more detailed view of the lithographic apparatus.

FIG. 2 shows the lithographic apparatus 100 in more detail, including the source collector module SO, the illumination system IL, and the projection system PS. An EUV radiation emitting plasma 210 may be formed by a plasma source. EUV radiation may be produced by a gas or vapor, for example Xe gas, Li vapor or Sn vapor in which the radiation emitting plasma 210 is created to emit radiation in the EUV range of the electromagnetic spectrum. In an embodiment, a plasma of excited tin (Sn) is provided to produce EUV radiation.

The radiation emitted by the radiation emitting plasma 210 is passed from a source chamber 211 into a collector chamber 212.

The collector chamber 212 may include a radiation collector CO. Radiation that traverses the radiation collector CO can be focused in a virtual source point IF. The virtual source point IF is commonly referred to as the intermediate focus, and the source collector module SO is arranged such that the virtual source point IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the unpatterned beam 21, at the patterning device MA, as well as a desired uniformity of radiation intensity at the patterning device MA. Upon reflection of the unpatterned beam 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in the illumination system IL and the projection system PS. Further, there may be more mirrors present than those shown in the Figures, for example there may be 1-6 additional reflective elements present in the projection system PS than shown in FIG. 2.

Alternatively, the source collector module SO may be part of an LPP radiation system.

As depicted in FIG. 1, in an embodiment the lithographic apparatus 100 comprises an illumination system IL and a projection system PS. The illumination system IL is configured to emit a radiation beam B. The projection system PS is separated from the substrate table WT by an intervening space. The projection system PS is configured to project a pattern imparted to the radiation beam B onto the substrate W. The pattern is for EUV radiation of the radiation beam B.

The space intervening between the projection system PS and the substrate table WT can be at least partially evacuated. The intervening space may be delimited at the location of the projection system PS by a solid surface from which the employed radiation is directed toward the substrate table WT.

In an embodiment the lithographic apparatus 100 comprises a dynamic gas lock. The dynamic gas lock comprises a membrane assembly 80. In an embodiment the dynamic gas lock comprises a hollow part covered by a membrane assembly 80 located in the intervening space. The hollow part is situated around the path of the radiation. In an embodiment the lithographic apparatus 100 comprises a gas blower configured to flush the inside of the hollow part with a flow of gas. The radiation travels through the membrane assembly before impinging on the substrate W.

In an embodiment the lithographic apparatus 100 comprises a membrane assembly 80. As explained above, in an embodiment the membrane assembly 80 is for a dynamic gas lock. In this case the membrane assembly 80 functions as a filter for filtering DUV radiation. Additionally or alternatively, in an embodiment the membrane assembly 80 is pellicle for the patterning device MA for EUV lithography. The membrane assembly 80 of the present invention can be used for a dynamic gas lock or for a pellicle or for another purpose. In an embodiment the membrane assembly 80 comprises a membrane layer 50 configured to transmit at least 80% of incident EUV radiation.

In an embodiment the pellicle is configured to seal off the patterning device MA to protect the patterning device MA from airborne particles and other forms of contamination. Contamination on the surface of the patterning device MA can cause manufacturing defects on the substrate W. For example, in an embodiment the pellicle is configured to reduce the likelihood that particles might migrate into a stepping field of the patterning device MA in the lithographic apparatus 100.

If the patterning device MA is left unprotected, the contamination can require the patterning device MA to be cleaned or discarded. Cleaning the patterning device MA interrupts valuable manufacturing time and discarding the patterning device MA is costly. Replacing the patterning device MA also interrupts valuable manufacturing time.

Figure 3:
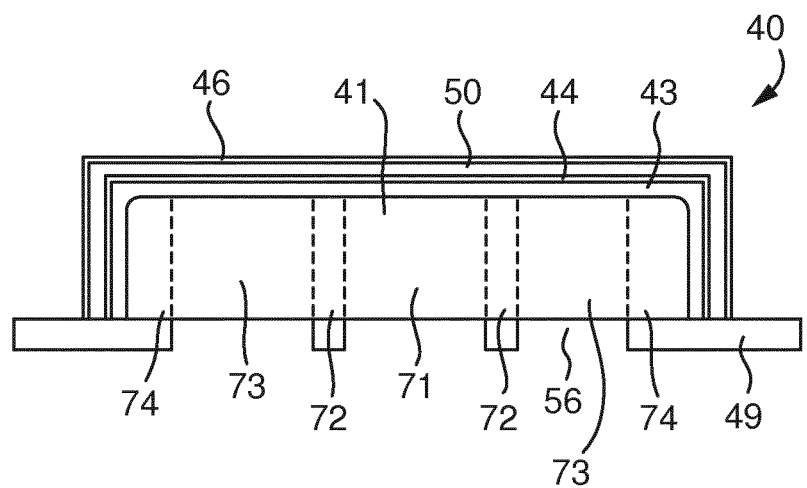
FIGS. 3 and 4 schematically depict stages of a method for manufacturing a pellicle according to an embodiment of the invention.
Figure 4:
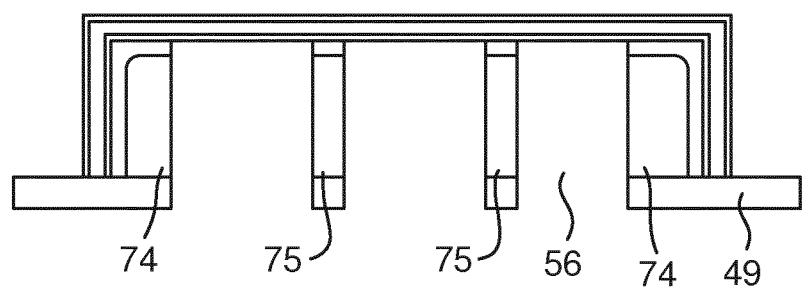

FIGS. 3 and 4 schematically depict stages of a method for manufacturing the membrane assembly 80 according to an embodiment of the invention. In an embodiment the method for manufacturing the membrane assembly 80 comprises providing a stack 40. As depicted in FIG. 3, the stack comprises a planar substrate 41.

In an embodiment the planar substrate 41 is formed from silicon. However the planar substrate 41 may also be formed from a glass/$SiO_2$ wafer or a SOI wafer. The planar substrate 41 has a shape such as a square, a circle or a rectangle, for example. The shape of the planar substrate 41 is not particularly limited.

The size of the planar substrate 41 is not particularly limited. For example, in an embodiment the planar substrate 41 has a diameter in the range of from about 100 mm to about 500 mm, for example about 200 mm. The thickness of the planar substrate 41 is not particularly limited. For example, in an embodiment the planar substrate 41 has a thickness of at least 100 μm (e.g. a pre-thinned wafer), for example at least 300 μm, optionally at least 400 μm. In an embodiment the planar substrate 41 has a thickness of at most 1,000 μm, optionally at most 800 μm. In an embodiment the planar substrate 41 has a thickness of about 725 μm. In an embodiment the planar substrate 41 has a thickness of at most 600 μm, optionally at most 400 μm. By providing a thinner planar substrate 41, the amount of the planar substrate 41 that needs to be selectively removed is reduced. Accordingly, by starting with a thinner planar substrate 41, an embodiment of the invention is expected to reduce the possibility of the membrane being damaged or contaminated during the step of selectively removing parts of the planar substrate 41. Additionally, by starting with a planar substrate 41, an embodiment of the invention is expected to make the manufacturing process more efficient.

Silicon can crystallise in a diamond cubic crystal structure. In an embodiment the planar substrate 41 comprises a cubic crystal of silicon. In an embodiment the planar substrate 41 has a <100> crystallographic direction.

As depicted in FIG. 4, in an embodiment the method for manufacturing the membrane assembly 80 comprises a step of etching the planar substrate 41. Part of the planar substrate 41 forms a border region 72 of the membrane assembly 80, the border region 72 forming a border 75. The border 75 holds the membrane of the membrane assembly 80. An embodiment of the invention is expected to achieve increased mechanical strength of the border 75 of the membrane assembly 80. The border 75 is formed at least partly by the planar substrate 41. The border 75 may be called a membrane assembly carrier.

In an embodiment the planar substrate 41 is polished. The stack 40 has a top side and a bottom side. The top side is depicted at the top of the stack 40 in the Figures. The bottom side is depicted at the bottom of the stack 40 in the Figures. In an embodiment the planar substrate 41 is polished at both the top side and the bottom side. However, this is not necessarily the case. In an embodiment the planar substrate 41 is polished on only one of the top side and the bottom side. In an embodiment the planar substrate 41 is thinned by polishing.

Figure 9:
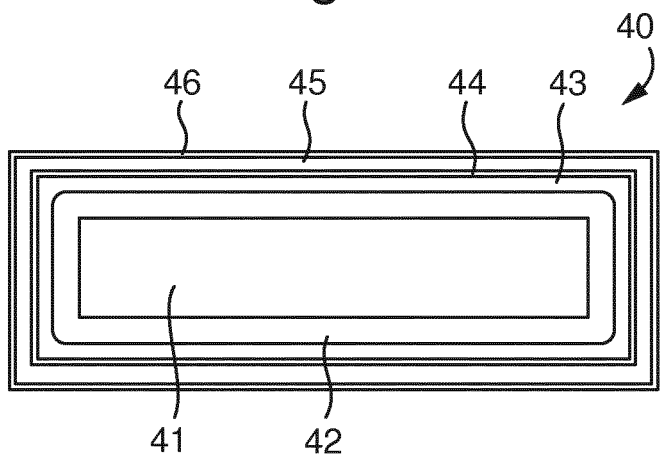
FIGS. 9 to 12 schematically depict stages of a method for manufacturing a pellicle according to an embodiment of the invention.

As depicted in FIG. 3, the stack 40 comprises at least one membrane layer 45, 50. The membrane assembly 80 comprises a membrane formed from the at least one membrane layer 50. In an embodiment at least one membrane layer 50 comprises silicon in one of its allotrope forms such as amorphous, monocrystalline, polycrystalline or nanocrystalline silicon. A nanocrystalline silicon means a polycrystalline silicon matrix containing a certain amorphous silicon content. In an embodiment polycrystalline or nanocrystalline silicon is formed by crystallising amorphous silicon in the at least one membrane layer 45. For example, as depicted in FIG. 9, in an embodiment a membrane layer 45 is added to the stack 40 as an amorphous silicon layer. The amorphous silicon layer crystallises into a polycrystalline or nanocrystalline silicon layer when a certain temperature is exceeded. For example, the membrane layer 45 as an amorphous silicon layer transforms into the membrane layer 50 as a polycrystalline or nanocrystalline silicon layer.

In an embodiment the amorphous silicon layer is in-situ doped during its growth. By adding a p- or n-type dope the silicon conductivity increases, which has a positive effect on handling the power of the EUV source.

As depicted in FIG. 3, in an embodiment the stack 40 comprises a lower sacrificial layer 43. The lower sacrificial layer 43 is disposed between the planar substrate 41 and the at least one membrane layer 45, 50. Reference numerals 45 and 50 both refer to the at least one membrane layer. Reference numeral 45 refers to the at least one membrane layer when the silicon is in its amorphous state. Reference numeral 50 refers to the at least one membrane layer when the silicon has been crystallized.

In an embodiment the planar substrate 41 comprises an inner region 71 and a border region 72. The border region 72 is around the inner region 71. The inner region 71 and the border region 72 are in the plane of the planar substrate 41. In an embodiment the border region 72 surrounds the inner region 71 in the plane of the planar substrate 41.

As depicted in FIG. 3, in an embodiment the planar substrate 41 comprises a bridge region 73 and an edge region 74. The bridge region 73 is around the border region 72. The edge region 74 is around the bridge region 73. The bridge region 73 and the edge region 74 are in the plane of the planar substrate 41. In an embodiment the bridge region 73 surrounds the border region 72 in the plane of the planar substrate 41. In an embodiment the edge region 74 surrounds the bridge region 73 in the plane of the planar substrate 41.

In an embodiment one of the steps of the method for manufacturing the membrane assembly 80 is the step of separating the border 75 (formed from the border region 72) from an edge section formed from the edge region 74. For example, if the planar substrate 41 is initially circular, whereas the target shape for the membrane assembly 80 is rectangular, then the curved edge section (formed from the edge region 74) is separated away from the rectangular border 75 (formed from the border region 72). According to the invention it is desired to have this step as early as possible in the manufacturing process such that cutting the border does not provide debris in the final membrane assembly 80.

In an alternative embodiment, the planar substrate 41 of the stack 40 has the same shape as the target shape for the membrane assembly 80. In such an embodiment it may not be necessary to separate away any edge section from the border 75. In such an embodiment, the planar substrate may not comprise any bridge region 73 or any edge region 74.

In an embodiment the stack 40 is rectangular. Accordingly, the stack 40 from which the membrane assembly 80 is manufactured has the target shape for the membrane assembly 80. This embodiment of the invention is expected to make it easier to manufacture the membrane assembly 80. In particular, it is not necessary to separate any edge section from the border 75 of the membrane assembly 80.

In an embodiment the method for manufacturing the membrane assembly 80 comprises selectively removing the inner region 71 and any bridge region 73 of the planar substrate 41. In an embodiment before the step of selectively removing the inner region 71 of the planar substrate 41, the stack 40 is positioned on a support such that the inner region 71 of the planar substrate 41 is exposed. By positioning the stack 40 on the support, the support bears the weight of the stack 40. The stack 40 does not need to bear its own weight. By positioning the stack 40 on the support, the stack 40 is more stable and less likely to be mechanically damaged during the step of selectively removing the inner region 71 of the planar substrate 41. By positioning the stack 40 such that the inner region 71 of the planar substrate 41 is exposed, the inner region 71 can be accessed by an etchant in order to selectively remove the inner region 71 and any bridge region 73 of the planar substrate 41.

In an embodiment the inner region 71 of the planar substrate 41 is selectively removed using a non-liquid etchant (i.e. a non-wet etching process). By using a non-liquid etchant, it is not necessary to handle the stack 40 so as to place the stack 40 in contact with a liquid etchant (e.g., by putting the stack 40 in a bath of liquid etchant). Instead, a non-liquid etchant can be used to selectively remove the inner region 71 while the stack 40 is stably supported by the support. For example, the support may be a table or a clamp. In an embodiment the stack 40 is placed on a table surface, with the inner region 71 of the planar substrate 41 exposed at the top of the stack 40.

By using a non-liquid etchant, less handling of the stack 40 is required when selectively removing the inner region 71 of the planar substrate 41. Accordingly, there is no need for any extra manufacturing steps of mechanically protecting the stack 40 using a material that provides mechanical protection to the stack 40. This embodiment of the invention is expected to make it easier to manufacture the membrane assembly 80.

In an embodiment the inner region 71 of the planar substrate 41 is selectively removed in a non-wet etching process such as atomic layer etching, sputter etching, plasma etching, reactive-ion etching or deep reactive-ion etching.

Atomic layer etching is a technique which removes thin layers of material using sequential self-limiting reactions. An atomic layer etching process comprises a modification step to form a reactive layer, followed by a removal step to take off only this modified layer. For example, silicon of the planar substrate 41 can be etched by alternating a reaction with chlorine and etching with argon ions. Atomic layer etching is a particularly selective and precise technique. Accordingly, by using atomic layer etching, an embodiment of the invention is expected to achieve a membrane assembly 80 with a more precisely defined shape.

A sputter etching process comprises bombarding the inner region 71 of the planar substrate 41 with energetic ions of noble gases, for example argon ions. The energetic ions knock atoms from the inner region 71 by transferring momentum.

Plasma etching involves a high-speed stream of plasma of an appropriate gas mixture being shot in pulses at the inner region 71 of the planar substrate 41. The plasma source can be either charged ions or neutral atoms or radicals. The plasma generates volatile etch products at a temperature of about 295 K from the chemical reactions between the inner region 71 of the planar substrate 41 and the reactive species generated by the plasma.

Reactive-ion etching using chemically reactive plasma to remove material of the inner region 71 of the planar substrate 41. The plasma can be generated under low pressure by an electromagnetic field. High-energy ions from the plasma attach to the inner region 71 surface and react with it. Deep reactive-ion etching comprising alternating repeatedly between a standard, nearly isotropic plasma etch and deposition of a chemically inert passivation layer (e.g., $C_4F_8$).

As depicted in FIG. 3, in an embodiment the step of selectively removing the inner region 71 and any bridge region 73 of the planar substrate 41 comprises forming an etch mask layer 49 at the bottom surface of the stack 40. In an embodiment the etch mask layer 49 corresponds to the border region 72 and the edge region 74 of the planar substrate 41. In an embodiment the step of selectively removing the inner region 71 of the planar substrate 41 comprises anisotopically etching the inner region 71 of the planar substrate 41.

The etch mask layer 49 is used as an etch barrier, for the process of etching the planar substrate 41 from the bottom side of the stack 40. In an embodiment, the etch mask layer 49 is provided by initially covering both the top surface and the bottom surface of the stack 40 with the etch mask layer 49.

In an embodiment the etch mask layer 49 comprises amorphous or stoichiometric silicon nitride (e.g., a-$Si_3N_4$ or SiN). The etch mask layer 49 is resistant to the means used to selectively remove the inner region 71 of the planar substrate 41.

As depicted in FIG. 3, in an embodiment etch openings 56 are created as openings in the etch mask layer 49. The material that forms the etch mask layer 49 is removed in regions corresponding to the etch openings 56. The etch openings 56 extend into the region where the material that forms the etch mask layer 49 is removed from the back surface of the stack 40.

As depicted in FIG. 3, in an embodiment the stack 40 comprises a lower capping film 44. The lower capping film 44 is disposed between the planar substrate 41 and the membrane layer 45, 50. When the stack 40 comprises the lower sacrificial layer 43, the lower capping film 44 is disposed between the lower sacrificial layer 43 and the membrane layer 45, 50. In an embodiment the lower capping film 44 forms part of the membrane of the membrane assembly 80 produced by the method according to an embodiment of the invention.

The lower capping film 44 is configured to contain the membrane layer 50 of the membrane of the membrane assembly 80 produced by the manufacturing method. This is particularly the case when an upper capping film 46 is provided in addition to the lower capping film 44, as shown in FIG. 3, for example. The lower capping film 44 and the upper capping film 46 are configured to reduce the distribution of debris when the membrane of the membrane assembly 80 breaks.

In an embodiment, each of the lower capping film 44 and the upper capping film 46 has a thickness of less than 3 nm. In an embodiment the combined thickness of the lower capping film 44, the membrane layer 45 and the upper capping film 46 is approximately 50 nm. In an embodiment the material for the upper capping film 46 is the same as the material for the lower capping film 44.

During use of the lithographic apparatus 100, it is possible for the membrane assembly 80 to break. When the membrane assembly 80 breaks, the membrane can break up into many particles. In particular, if the membrane layer 50 is formed from a material having a brittle nature, the membrane layer 50 can shatter into many particles when the membrane assembly 80 breaks. The debris from the broken membrane assembly 80 can contaminate other parts of the lithographic apparatus 100. For example, debris from the broken membrane assembly 80 can contaminate optical components of the lithographic apparatus 100. Contamination from the debris of the broken membrane assembly 80 can reduce the quality of optical functions carried out by the optical components of the lithographic apparatus 100.

For example, in an embodiment the membrane layer 50 is formed from polycrystalline or nanocrystalline silicon. Polycrystalline or nanocrystalline silicon has a brittle nature. Hence, a membrane assembly 80 comprising a membrane that comprises a membrane layer 50 formed from polycrystalline or nanocrystalline silicon can shatter into many particles when the membrane assembly 80 breaks. An embodiment of the invention is expected to achieve an improvement in the mechanical properties of the membrane assembly 80.

In an embodiment the material for the lower capping film 44 is a silicon nitride. For example, in an embodiment the material for the lower capping film 44 is an amorphous silicon nitride. However, other silicon nitrides may be suitable. In an embodiment the lower capping film 44 is thick enough to allow the lower capping film 44 to perform its function of containing the membrane layer 50 when the membrane assembly 80 breaks. In an embodiment the thickness of the lower capping film 44 is at least about 1 nm, and optionally at least about 2 nm. In an embodiment the lower capping film 44 is thin enough so that the membrane of the membrane assembly 80 including the lower capping film 44 has sufficiently good optical properties, particularly for transmission of EUV radiation. In an embodiment the thickness of the lower capping film 44 is at most about 10 nm, and optionally at most about 5 nm. In an embodiment the thickness of the lower capping film 44 is about 2.5 nm.

The method of applying the lower capping film 44 to the stack 40 is not particularly limited. In an embodiment the lower capping film 44 is applied to the stack by chemical vapour deposition, for example low pressure chemical vapour deposition at a temperature of about 850° C. However, in an alternative embodiment the lower capping film 44 is applied to the stack 40 by a sputtering method or by a thin filming method, for example.

It is not necessary for the lower capping film 44 to be provided. In an embodiment the stack 40 does not comprise any lower capping film 44. In an embodiment the membrane assembly 80 produced by the manufacturing method does not comprise any lower capping film 44.

In an embodiment the membrane layer 45 is applied to both the top surface and the bottom surface of the stack 40. The membrane layer 45 can be removed from the bottom side of the stack 40 in a later process step. However, this is not necessarily the case. In an alternative embodiment the membrane layer 45 is applied only to the top side of the stack 40. The membrane layer 45 at the top side of the stack 40 becomes the membrane layer 50 in the membrane of the membrane assembly 80 produced by the manufacturing method.

In an embodiment the membrane layer 45 is applied to the stack 40 by a chemical vapour deposition method. For example, in an embodiment the membrane layer 45 is applied by low pressure chemical vapour deposition at a temperature of about 560° C. However, other methods such as a sputtering method and a thin filming method can be used.

In an embodiment the membrane layer 45 is thin enough that its transmission for EUV radiation is sufficiently high, for example greater than 50%. In an embodiment the thickness of the membrane layer 45 is at most about 200 nm, and optionally at most about 150 nm. A 150 nm thick pure Si membrane would transmit about 77% of incident EUV radiation. In an embodiment the thickness of the membrane layer 45 is at most about 100 nm. A 100 nm thick pure Si membrane would transmit about 84% of incident EUV radiation.

In an embodiment the membrane layer 45 is thick enough that it is mechanically stable when the membrane assembly 80 is fixed to the patterning device MA of the lithographic apparatus 100 and during use of the lithographic apparatus 100. In an embodiment the thickness of the membrane layer 45 is at least about 10 nm, optionally at least about 20 nm, and optionally at least about 35 nm. In an embodiment the thickness of the membrane layer 45 is about 55 nm.

As depicted in FIG. 3, in an embodiment the stack 40 comprises an upper capping film 46. Features of the upper capping film 46 can be selected and varied in the same manner as the features of the lower capping film 44 described above. Accordingly, the features of the upper capping film 46 will not be described in any further detail here.

The upper capping film 46 is disposed such that the membrane layer 45, 50 is disposed between the planar substrate 41 and the upper capping film 46. It is not necessary for the upper capping film 46 to be provided. In an embodiment the stack 40 does not comprise any upper capping film 46. In an embodiment the membrane assembly 80 produced by the manufacturing method does not comprise any upper capping film 46 in the membrane of the membrane assembly 80.

FIGS. 5 to 8 schematically depict stages of a method for manufacturing a membrane assembly 80 for EUV lithography according to an embodiment of the invention. In an embodiment a wet etchant such as KOH is used to selectively remove the inner region 71 and any bridge region 73 of the planar substrate 41. Hence, in an embodiment the etch mask layer 49 is chemically resistant to the wet etchant. Other wet etchants such as TMAH (tetramethylammonium hydroxide) and EDP (an aqueous solution of ethylene diamine and pyrocatechol) can be used.

When a wet etchant is used to selectively remove the near region 71 of the planar substrate 41, the stack 40 is provided with a mechanical protection material 66, shown in FIG. 5. The mechanical protection material 66 is configured to mechanically protect the border region 72 during the step of selectively removing the inner region 71 of the planar substrate 41.

FIG. 6 shows the stack 40 after the step of selectively removing the inner region 71 and the bridge region 73 of the planar substrate 41. The oxidized layer 42 protects the membrane from the wet etching step.

The step of selectively removing the inner region 71 and any bridge region 73 of the planar substrate 41 can result in damage to the membrane assembly 80 during its manufacture. At this stage of the manufacturing method, the stack 40 is particularly thin. When the inner region 71 of the planar substrate 41 is selectively removed, the stack 40 comprises a mixture of extremely thin portions (where the inner region 71 has been removed) and thin portions (corresponding to the border 75 where the border region 72 of the planar substrate 41 has not been removed). This can result in mechanical stresses on the stack 40. It is possible for the stack 40 to break, or undesirably be damaged in other ways.

In an embodiment the mechanical protection material 66 is thick enough to provide sufficient mechanical protection to the stack 40. In an embodiment the mechanical protection material has a thickness of at least about 1 nm, and optionally at least about 2 μm. In an embodiment the mechanical protection material 66 is thin enough so as to sufficiently reduce the process time required for applying the mechanical protection material 66. In an embodiment the mechanical protection material has a thickness of at most about 10 μm, and optionally at most about 5 μm. In an embodiment the mechanical protection material has a thickness of about 4 μm.

The mechanical protection material 66 is sufficiently mechanically robust so as to provide mechanical protection to the border region 72 during the step of selectively removing the inner region 71 of the planar substrate 41. The mechanical protection material 66 may be a conformal coating for protecting the coated surface, having good barrier properties such as being resistant to solvents (e.g. insoluble at room temperature), moisture, corrosion, chemical attack. It is generally desired that the mechanical protection material 66 provides a uniform layer thickness with no pinholes. In an embodiment the step of selectively removing the inner region 71 of the planar substrate 41 comprises using a chemical etchant so as to selectively remove the inner region 71 of the planar substrate 41. For example, in an embodiment the chemical etchant is KOH providing a temporary wet-etch protection. The mechanical protection material is chemically resistant to the chemical etchant. For example, in an embodiment the mechanical protection material 66 is chemically resistant to KOH. This means that when the chemical etchant is used, the mechanical protection material 66 is either not etched away at all, or is etched away at a much lower etching rate compared to the inner region 71 of the planar substrate 41.

In an embodiment the mechanical protection material 66 is applied as a continuous layer having substantially no holes in it. The mechanical protection material 66 forms a layer that is impermeable. During a process step of selectively removing parts of the planar substrate 41 using an etchant, the etchant cannot diffuse through the mechanical protection material 66 applied to the stack 40.

As depicted in FIG. 6, in an embodiment the planar substrate 41 comprises an oxidized layer 42. The oxidized layer 42 is part of the planar substrate 41. The rest of the planar substrate 41 forms a non-oxidized layer of the planar substrate 41. The oxidized layer 42 is a sacrificial layer. The oxidized layer 42 forms an etch barrier when the non-oxidized layer of the planar substrate 41 is etched. As depicted in FIG. 6, for example, the planar substrate 41 is etched from the bottom side. The oxidized layer 42 is resistant to the wet etchant.

In an embodiment the oxidized layer 42 has a thickness greater than 100 nm, optionally greater than 200 nm, and optionally greater than 300 nm. For example, in an embodiment the oxidized layer 42 has a thickness of about 350 nm or about 400 nm. An embodiment of the invention is expected to achieve an improved robustness to the step of etching the planar substrate 41.

In an embodiment the oxidized layer 42 is formed as a thin layer of oxide on outer surfaces of the planar substrate 41. In an embodiment the oxidized layer 42 is formed by a thermal oxidation process, for example as a thermal wet oxide. In an embodiment the oxidized layer 42 and the etchant used for etching the planar substrate 41 are configured such that the etch rate of the oxidized layer 42 in the etchant is less than about 5 nm/minute, for example about 3 nm/minute. In an embodiment the oxidized layer 42 comprises amorphous silicon dioxide.

As depicted in FIG. 6, in an embodiment the stack 40 comprises a lower sacrificial layer 43. The lower sacrificial layer 43 protects the at least one membrane layer 45, 50 during the selective removal of any layer such as the oxidized layer 42 of the planar substrate 41 present at the bottom of the membrane.

The thickness of the lower sacrificial layer 43 is not particularly limited. In an embodiment the thickness of the lower sacrificial layer 43 is at least about 5 nm, and optionally at least about 10 nm. In an embodiment the thickness of the lower sacrificial layer 43 is at most about 100 nm, and optionally at most about 50 nm. In an embodiment the thickness of the lower sacrificial layer 43 is about 20 nm.

In an embodiment the lower sacrificial layer 43 is formed from a material such as amorphous silicon. However, this is not necessarily the case.

The method of depositing the lower sacrificial layer 43 onto the stack 40 is not particularly limited. In an embodiment the lower sacrificial layer 43 is applied to the stack 40 by chemical vapour deposition. For example, in an embodiment the lower sacrificial layer 43 is applied to the stack 40 by low pressure chemical vapour deposition at a temperature in a range from 300 to 700° C. However, this is not necessarily the case. For example, in an alternative embodiment the lower sacrificial layer 43 is applied to the stack 40 by a sputtering method or by a thin filming method, for example.

Figure 7:
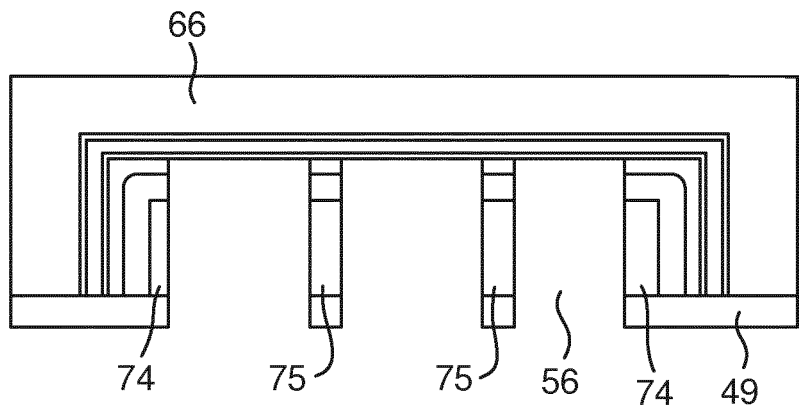

FIG. 7 schematically depicts the stack 40 after the step of etching the oxidized layer 42 and the lower sacrificial layer 43.

Figure 8:
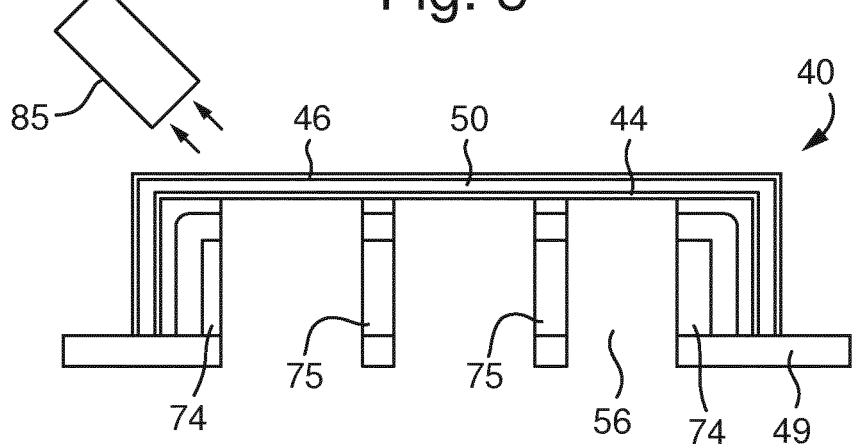

As depicted in FIG. 8, the method for manufacturing the membrane assembly 80 comprises removing the mechanical protection material 66. In an embodiment the mechanical protection material 66 is removed using a fluoride etchant. By using a fluoride etchant instead of an oxidizing etchant, there is a reduced possibility of the membrane of the membrane assembly 80 being oxidized during the step of removing the mechanical protection material 66.

As a comparative example, an oxidizing etchant can be used to remove the mechanical protection material 66. This can result in unwanted, non-uniform and uncontrolled oxidation of the upper capping film 46 of the membrane assembly 80. For example, if an oxidative plasma is used to remove the mechanical protection material 66, then the membrane of the membrane assembly 80 can be less uniform. Oxidation of the upper capping film 46 can add oxygen atoms to the membrane such that the membrane becomes thicker in some places. This can increase the absorption of EUV radiation.

By providing that the mechanical protection material 66 is removed using a fluoride etchant, the membrane of the membrane assembly 80 is expected to be more uniform and have a more controlled shape. This is expected to improve the imaging properties of the membrane assembly 80, for example reducing the level of absorption of EUV radiation.

In an embodiment the fluoride etchant comprises a xenon difluoride (XeF$_2$) plasma. Other fluoride etchants can be used as appropriate.

Figure 11:
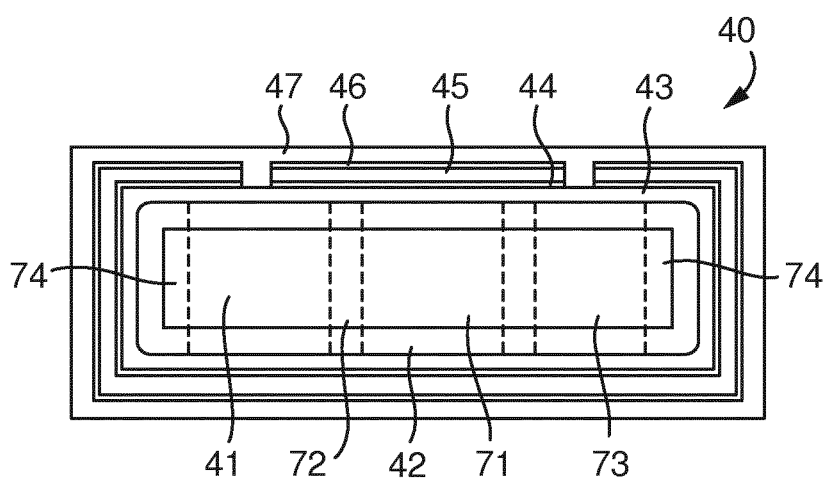

As depicted in FIG. 11, in an embodiment the stack 40 comprises an upper sacrificial layer 47. The upper sacrificial layer 47 is disposed such that the membrane layer 45, 50 is disposed between the planar substrate 41 and the upper sacrificial layer 47.

The other features relating to the upper sacrificial layer 47 can be selected and varied in the same way that the features of the lower sacrificial layer 43 can be selected and varied. The features of the lower sacrificial layer 43 were described above with particular reference to FIG. 5. Accordingly, the further features of the upper sacrificial layer 47 will not be discussed in any further detail here.

In an embodiment the method for manufacturing the membrane assembly 80 comprises selectively removing the inner region 71 and any bridge region 73 of the planar substrate 41. As a result the membrane assembly 80 comprises a membrane from the membrane layer 50 and a border 75 holding the membrane. The border 75 is formed from the border region 72 of the planar substrate 41.

The border 75 improves the mechanical stability of the membrane of the membrane assembly 80. An embodiment of the invention is expected to achieve an improvement in the mechanical stability of the membrane assembly 80. This makes it easier to package and transport the membrane assembly 80 without the membrane assembly 80 being damaged. This also makes it easier for the membrane assembly 80 to be attached to the patterning device MA by a frame without the membrane assembly 80 being damaged.

In an embodiment the border 75 of the membrane assembly 80 is configured to be connected to the frame that connects the membrane assembly 80 to the patterning device MA. The frame does not need to be attached directly to the membrane of the membrane assembly 80. The frame can be attached to the border 75 of the membrane assembly 80. This reduces the possibility of the membrane of the membrane assembly 80 being damaged during the process of fitting the membrane assembly 80 to the patterning device MA.

In an embodiment the etch mask layer 49 is deposited by chemical vapour deposition. For example, in an embodiment the etch mask layer 49 is applied by low pressure chemical vapour deposition at a temperature of about 850° C.

By applying a high temperature, the nature of the membrane layer 45 can be changed. For example, when the membrane layer 45 is initially applied as amorphous silicon, the membrane layer 45 may be transformed into a membrane layer 50 formed of polycrystalline or nanocrystalline silicon. The temperature causes the amorphous silicon to crystallise into polycrystalline or nanocrystalline silicon.

Polycrystalline silicon and nanocrystalline silicon each have high transmission for EUV radiation. Polycrystalline silicon and nanocrystalline silicon each have good mechanical strength. It is easier to manufacture the membrane assembly 80 having a membrane formed from polycrystalline or nanocrystalline silicon than to fabricate a membrane formed of another material such as a multi-lattice material. Polycrystalline silicon and nanocrystalline silicon substantially filter EUV radiation.

However, it is not essential for the membrane of the membrane assembly 80 to be formed from polycrystalline or nanocrystalline silicon. For example, in an alternative embodiment the membrane of the membrane assembly 80 is formed from a multi-lattice membrane or a silicon nitride.

In a further alternative embodiment the membrane of the membrane assembly 80 is formed from monocrystalline silicon. In such an embodiment the monocrystalline silicon membrane can be formed by a silicon on insulator (SOI) technique. The starting material for this product is a so-called SOI substrate. An SOI substrate is a substrate comprising a silicon carrier substrate with a thin, monocrystalline silicon layer on top of a buried isolating SiO$_2$ layer. In an embodiment the thickness of the monocrystalline silicon layer can range between about 5 nm to about 5 μm. In an embodiment the silicon membrane layer is present on the SOI substrate before the SOI substrate is used in the method of manufacture.

FIGS. 9 to 12 schematically depict stages in a method for manufacturing a membrane assembly 80 for EUV lithography, according to an embodiment of the invention. FIG. 9 depicts the stack 40, which comprises the planar substrate 41, the oxidized layer 42, the lower sacrificial layer 43, the lower capping film 44, the at least one membrane layer 45 and the upper capping film 46. The oxidized layer 42, the lower sacrificial layer 43, the lower capping film 44 and the upper capping film 46 are optional.

Figure 10:
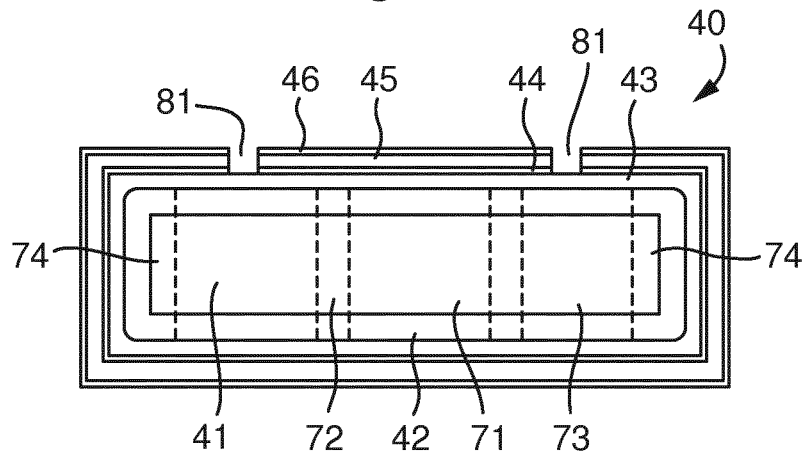

As depicted in FIG. 10, in an embodiment the method comprises the step of forming a bridge groove 81. The bridge groove 81 is a groove that is termed a "bridge" groove because it is formed at a position corresponding to the bridge region 73 of the planar substrate 41. The bridge groove 81 is formed through the at least one membrane layer 45 adjacent to the bridge region 73 of the planar substrate 41. In an embodiment in which the lower capping film 44 and the upper capping film 46 are provided, the bridge groove 81 is formed through the lower capping film 44 and the upper capping film 46. The bridge groove 81 is formed through the layers that form the membrane in the membrane assembly 80.

In an embodiment the bridge groove 81 is a deep through-hole in the pellicle bulk. The purpose of the bridge groove 81 is so that it is not necessary to break the at least one membrane layer 45 above the bridge region 73 at the end of the method for manufacturing the membrane assembly 80.

In an embodiment the bridge groove 81 is formed by a laser, (N)IR radiation or EUV radiation. In an embodiment a laser, (N)IR radiation or EUV radiation is used to burn through the at least one membrane layer 45 and the lower capping film 44 and the upper capping film 46. In an embodiment the method comprises forming a rectangular groove (i.e. the bridge groove 81) in a non-rectangular stack 40. By forming a rectangular groove in a non-rectangular stack 40, the membrane is separated from the part of the at least one membrane layer 45, 50 that is to be discarded at a relatively early stage in the method. Accordingly, it is not necessary to mechanically break the at least one membrane layer 50 at the end of the manufacturing method in order to provide a membrane having the desired shape.

In order to provide a rectangular membrane assembly 80, the bridge groove 81 is formed in a rectangular shape (when the stack 40 is viewed in plan view).

After the bridge groove 81 has been formed, the bridge groove 81 can be filled with a filler material such as a sacrificial layer or a mechanical protection material. As depicted in FIG. 11, in an embodiment an upper sacrificial layer 47 is provided to the stack 40. The material of the upper sacrificial layer 47 fills in the bridge groove 81. Alternatively, a material such as the mechanical protection material 66 can be used to fill the bridge groove 81.

Figure 12:
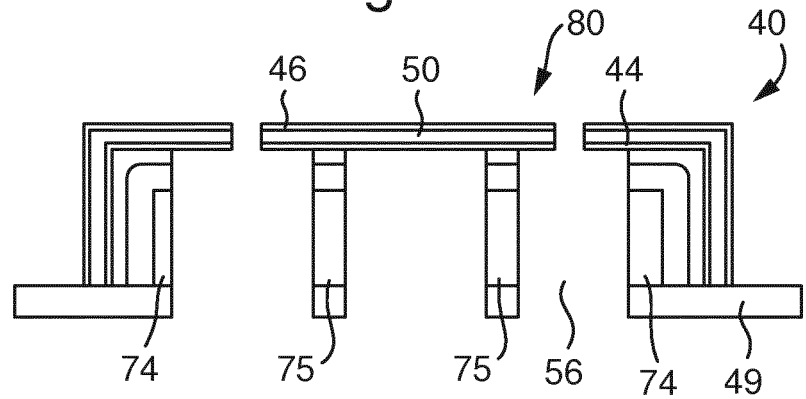

FIG. 12 schematically depicts a later step in the method for manufacturing the membrane assembly 80. As shown in FIG. 12, the inner region 71 and the bridge region 73 of the planar substrate 41 have been selectively removed (together with any oxidized layer 42 and any lower sacrificial layer 43). The upper sacrificial layer 47 has also been removed.

The edge section (formed by the edge region 74 of the planar substrate 41) is separated from the border 75. For example, the edge section is separated from the border 75 by selectively removing the bridge region 73 of the planar substrate 41. By removing the bridge region 73 the bridge groove 81 becomes an open area allowing removal of the edge section without cutting or breaking the at least one membrane layer 50. When the edge section is separated from the border 75, the at least one membrane layer 50 adjacent the edge section is separated from the membrane of the membrane assembly 80 by the bridge groove 81.

Hence, once the bridge region 73 is selectively removed, the membrane of the membrane assembly 80 is separated away (via the bridge groove 81 which forms a through-groove in the stack 40) from the peripheral portion of the at least one membrane layer 50 that is to be discarded. This means that it is not necessary to perform a subsequent step of breaking the at least one membrane layer 50. Accordingly, this reduces the possibility of any contaminant particles formed by breaking the at least one membrane layer 50 from being produced. This reduces the possibility of any contaminant particles adhering to the membrane of the membrane assembly 80. Contaminant particles can include flakes of silicon. Any such contaminant particles on the finalized membrane assembly 80 can reduce the optical performance of the membrane assembly 80. Loose hanging flakes of silicon that overlap with the border 75 can be released and adhered to the membrane of the membrane assembly 80. The contaminant particles can adhere relatively easily to the membrane because the contaminant particles are so thin.

In an embodiment the bridge groove 81 is formed such that part of the at least one membrane layer 45 extends radially outwardly of the border region 72 of the planar substrate 41. This is shown in FIG. 10, where part of the at least one membrane layer 45 extends outwardly beyond the border region 72. Accordingly, when the edge section is separated from the border 75 (at the end of the method for manufacturing the method for manufacturing the membrane assembly 80), that part of the membrane layer 50 extends radially outwardly of the border 75. This is shown in FIG. 12. By controlling the position of the bridge groove 81 relative to the border region 72 of the planar substrate 41, it is possible to tune the position of the edge of the membrane in the membrane assembly.

In an embodiment a pillar can be provided in the bridge groove 81. The pillar is for holding the gap between the membrane and the peripheral part of the at least one membrane layer 45 that is to be discarded. Once the step of selectively removing parts of the planar substrate 41 has been performed, the pillar can be removed, such that the membrane is separated from the rest of the at least one membrane layer 50. Accordingly, it is not necessary to physically break the membrane away from the rest of the at least one membrane layer 50 at the end of the method for manufacturing the membrane assembly 80.

In an embodiment the stack 40 is rectangular. In other words, it is possible to start the method with a rectangular (or squared) planar substrate 41. The planar substrate 41 can have substantially the same shape as the desired shape of the membrane assembly 80 produced by the method. In such an embodiment, it is not necessary to break the membrane assembly 80 away from any edge section of the planar substrate 41 at the end of the planar substrate 41 at the end of the method for manufacturing the membrane assembly 80. This reduces the possibility of the membrane being contaminated by contaminant particles adhering to the membrane.

In an embodiment, edges of the at least one membrane layer 45 in the stack 40 are rounded or chamfered. By providing a chamfer or bevel or rounded edges, the edges of the membrane assembly 80 are less sharp. In particular, anisotropic etching can result in particularly sharp edges for the membrane assembly 80. For example, the edges of the membrane of the membrane assembly 80 can have the shape of a sharp triangle. This increases the possibility of the corner of the edge breaking away resulting in the creation of contaminant particles. The contaminant particles can have a diameter in the region of from about 20 nm to about 1 µm. By providing a chamfer or a bevel or rounded edges, the possibility of the corner of the membrane breaking to create particles is reduced.

Figure 13:
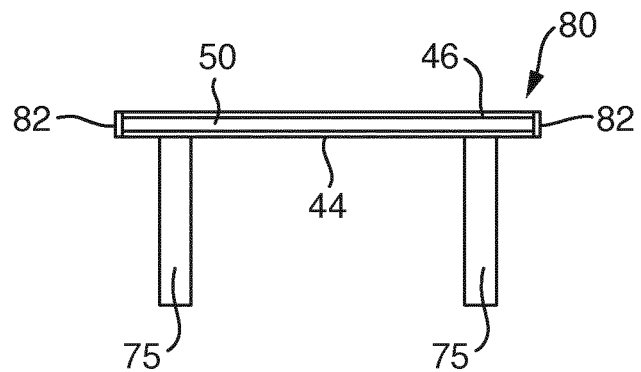
FIG. 13 schematically depicts a membrane assembly according to an embodiment of the invention.

FIG. 13 depicts a membrane assembly 80 according to an embodiment of the invention. As depicted in FIG. 13, in an embodiment the method comprises applying a passivation coating 82 to the edges of the at least one membrane layer 50 after separating the edge section from the border 75. The edges can be coated with a thick sticky layer. For example, a spray coating may be used.

In an embodiment the thickness of the passivation coating 82 is in the range of from about 1 µm to about 10 µm. The passivation coating 82 passivates the edge of the at least one membrane layer 50. In an embodiment the passivation coating 82 is applied in the form of a sticky tape applied around the edge. The passivation coating 82 is applied to the edge of the earliest one membrane layer 50 after chipping the unwanted peripheral section of the at least one membrane layer 50 off.

In an embodiment the passivation coating 82 is applied using atomic layer deposition, chemical vapour deposition, electroplating or dip coating. In an embodiment the passivation coating 82 comprises a metal such as Ru. However, the passivation coating 82 may also comprise a silicide, an oxide or a nitride. The passivation coating 82 can be deposited to the edge of the at least one membrane layer 50 by, for example, chemical vapour deposition. In an embodiment the passivation coating 82 is applied all around the membrane assembly 80 (not just to the edges of the at least one membrane layer 50). For example, the passivation coating 82 can be applied all around the membrane assembly 80 via atomic layer deposition or chemical vapour deposition. Electroplating can also be used to make conformal Ru coatings. In an embodiment to Ru layers are provided for protection of the membrane assembly 80.

In an embodiment the passivation coating 82 is applied using physical vapour deposition. A shadow mask may be used such that only the edges of the at least one membrane layer 50 receives the passivation coating layer 82. The passivation coating 82 can be coated locally onto the edges of the silicon membrane via physical vapour deposition. A shadow mask can be used to mask the inner part of the membrane. The rest of the membrane can be sputtered by the material of the passivation coating 82. In particular, this process, which may be called shadow sputtering, may be appropriate if the mechanical protection material 66 (e.g. a densely crosslinked polymer) is removed using a non-oxidizing plasma.

The passivation coating 82 reduces the possibility of the corner of the edge of the membrane breaking away to create contaminant particles. Accordingly, an embodiment of the invention is expected to achieve a reduction in contaminant particles adhered to the membrane of the membrane assembly 80. This can result in a membrane assembly 80 having improved transmission for EUV radiation and more consistent optical properties across its area.

In an embodiment the at least one membrane layer 45 comprises an amorphous material. By starting with an amorphous material instead of crystalline silicon, for example, the edges of the membrane assembly 80 will be less brittle. Accordingly, using an amorphous material can reduce the possibility of contaminant particles being produced when the membrane assembly 80 is broken away from the unwanted sections of the planar substrate 41 and the at least one membrane layer 50.

In an embodiment the method for manufacturing the membrane assembly 80 comprises oxidizing or nitriding the edges of the at least one membrane layer 50 after separating the edge section from the border 75. By oxidizing or nitriding the edges of the at least one membrane layer 50, the membrane is made less reactive. For example, the native oxide is less reactive than pure silicon. Accordingly, by oxidizing or nitriding the edges of the silicon membrane, the chances of particle debris being created that contact with pellicle tooling is reduced.

Dip coating can be used to selectively apply Ru layers to protect the edges of the silicon membrane.

Figure 14:
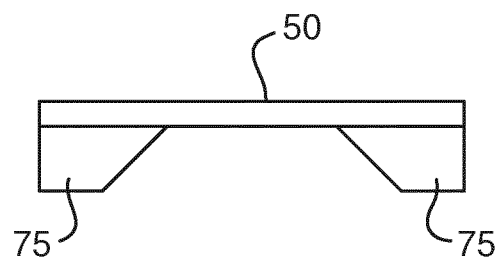
FIG. 14 schematically depicts a membrane assembly according to a comparative example.

FIG. 14 schematically depicts a membrane assembly in which the at least one membrane layer 50 spans across the border 75 (which may also be called a frame). The at least one membrane layer 50 is deposited directly on top of the planar substrate 41. The membrane is then made freestanding due to selectively anisotropically back etching of the planar substrate 41. In an embodiment the material for the at least one membrane layer 50 is SiN. Other materials are also possible.

As depicted in FIG. 14 it is possible for there to be sharp edges or transitions between the at least one membrane layer 50 and the border 75. Step defects can also result from the anisotropic etching step used in the fabrication process. The anisotropic etching follows crystallographic planes. Accordingly, step defects can exhibit particularly sharp corners where particularly high stress concentrations can occur. This can result in failure or breaking of the membrane assembly 80 at positions where the particularly high stress concentrations occur.

The shape of the border 75 may vary depending on the etching process used to selectively remove parts of the planar substrate 41. The shape of the border 75 may also vary depending on the material used to form the border 75. The shape of the border 75 shown in FIG. 14 is a typical shape that results from anisotropic etching when the material used to form the planar substrate 41 is a crystalline material.

Figure 15:
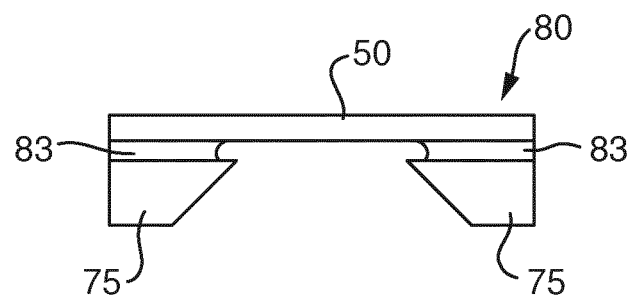
FIG. 15 schematically depicts a membrane assembly according to an embodiment of the invention.

FIG. 15 schematically depicts a membrane assembly 80 according to an embodiment of the invention. As depicted in FIG. 15, in an embodiment the stack 40 is provided with an intermediate layer 83. The intermediate layer 83 is positioned between the planar substrate 41 and the at least one membrane layer 45. The method for manufacturing the membrane assembly 80 comprises isotropically etching the intermediate layer 83 after the step of selectively removing the inner region 71 of the planar substrate 41.

The intermediate layer 83 is purposely introduced between the border 75 and the at least one membrane layer 50. In an embodiment the intermediate layer is thicker than the at least one membrane layer 50. The intermediate layer 83 is etched isotropically. The intermediate layer 83 is etched using an etching agent that is selective. The intermediate layer 83 is etched, without the at least one membrane layer 50 being etched.

As depicted in FIG. 15 schematically, the isotropically etched intermediate layer 83 smoothens the sharp edges of the transition from the border 75 to the at least one membrane layer 50. This results in significantly lower stress concentrations, and thus a reduced chance of failure of the membrane.

Isotropic etching etches at the same rate in all directions. On the other hand, anisotropic etching etches significantly faster in certain directions due to crystal plane orientations. Anisotropic etching inherently leads to atomically sharp edges and thus higher stress concentrations. For glassy or amorphous materials, etching is typically isotropic. In an embodiment the intermediate layer 80 comprises silicon dioxide or amorphous silicon or a metal layer.

The isotropically etched intermediate layer 83 mitigates stresses at the locations of any step defects. The intermediate layer 83 also reduces stresses throughout the entire transition from the border 75 to the membrane. The intermediate layer 83 also reduces stresses that the corners of the membrane assembly 80. In an embodiment the intermediate layer 83 is significantly thicker than the membrane. For example, in an embodiment the intermediate layer 83 has a thickness of at least 50 nm, optionally at least 100 nm. In an embodiment the intermediate layer 83 has a thickness of at most 500 nm, optionally at most 200 nm. In an embodiment the etching agent used to isotropically etch the intermediate layer 83 is selective. This means that the etching agent is configured to etch the intermediate layer 83 and not the membrane structure.

In an embodiment the method for manufacturing the membrane assembly 80 comprises changing a pre-tension in the at least one membrane layer 45 of the stack 40 by one or more of an annealing process, ion beam modification, controlling a pressure applied to the stack 40 and controlling a temperature applied to the stack 40.

Pre-tension is applied to the at least one membrane layer 45 during the manufacturing process so that the membrane of the membrane assembly 80 will be straight and flat during use. If no pre-tension is applied, then the membrane may be undesirably flappy or wrinkled (wrinkling leading also to a non-uniform membrane thickness). A loose or a non-uniform thickness membrane can have poorer imaging properties. However, if the pre-tension is too high, then the membrane can be brittle and more susceptible to breaking. Accordingly, it is desirable to control the pre-tension to be within a target range.

In an embodiment the pre-tension of the at least one membrane layer 45 is controlled to be at least 80 MPa tensile. This pre-tension is built in when the at least one membrane layer 50 is formed. The pre-tension can henceforth be altered by heat treatment. In an embodiment the pre-tension can be applied to the lower capping film 44 and/or to the upper capping film 46. In an embodiment the pre-tension is applied to both the at least one membrane layer 45 (that forms the membrane) as well as to the lower capping film 44 and the upper capping film 46.

In an embodiment an annealing step is performed to increase the crystalline fraction of the at least one membrane layer 45 and/or to increase the stress in the at least one membrane layer 45. Ion beam modification (i.e. implantation) can be used to decrease the stress in the at least one membrane layer 45. Pre-tension can be introduced into the at least one membrane layer 45 between any other steps of the method for manufacturing the membrane assembly 80.

Pre-tension (which may also be called pre-stress) is introduced into the membrane in order to prevent heat induced buckling at higher temperatures during use of the membrane assembly 80.

In an embodiment, the method for manufacturing the membrane assembly 80 comprises introducing pre-tension into the membrane so that the membrane will have a stress closer to its design value in use. In use (e.g. when the membrane assembly 80 is used as a pellicle for a patterning device MA), the membrane is subjected to EUV radiation. The EUV radiation applied to the membrane assembly 80 during use can increase the tension in the membrane. Accordingly, in an embodiment, the method comprises introducing pre-tension into the membrane to a bevel below the desired tension during use of the membrane assembly 80. When the membrane assembly 80 is used, the additional EUV radiation that it is subjected to further increases the tension in the membrane so that the tension in the membrane is at or near its design value.

In some situations it may be advantageous to use wet etching to remove part of planar substrate 41. As mentioned above, in such case the stack 40 may need to be protected with a mechanical protection material 66, which can be removed later after the wet etching step.

Figure 16:
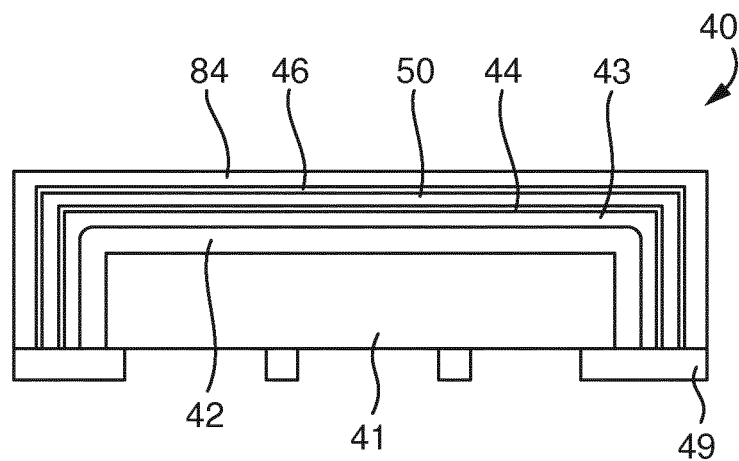
FIGS. 16 to 19 schematically depict stages of a method for manufacturing a pellicle according to an embodiment of the invention.
Figure 17:
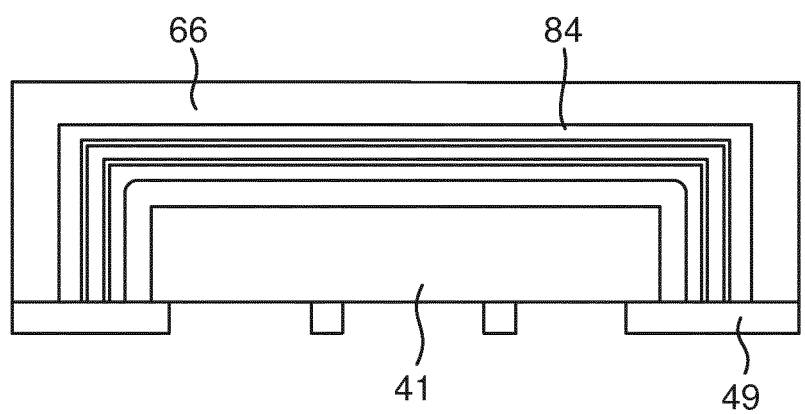

FIGS. 16 to 19 depict schematically steps of a method for manufacturing the membrane assembly 80 according to an embodiment of the invention. FIG. 16 schematically depicts the stack 40. As depicted in FIG. 16, in an embodiment the stack 40 is provided with an etch stop layer 84. The etch stop layer 84 is for protecting the stack 40 during the step of removing the mechanical protection material 66 (which is shown in FIG. 17). The etch stop layer 84 is applied to the top of the stack 40 before the mechanical protection material 66 is applied to the stack 40.

After the mechanical protection material 66 has been applied to the stack 40, the planar substrate 41 can be etched away for example using a wet etching. The mechanical protection material 66 protects in this case the rest of the stack 40 from the liquid etchant. Further etching processes may be required to etch away the oxidized layer 42 and any lower sacrificial layer 43.

Figure 18:
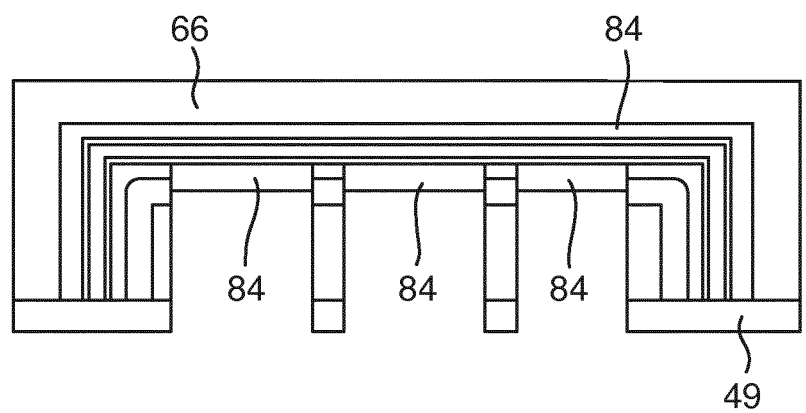

As depicted in FIG. 18, after the planar substrate 41 has been selectively etched, the etch stop layer 84 may be applied to the bottom of the stack 40. The etch stop layer 84 applied to the bottom of the stack 40 is for protecting the membrane from the etchant used to remove the mechanical protection material 66.

Figure 19:
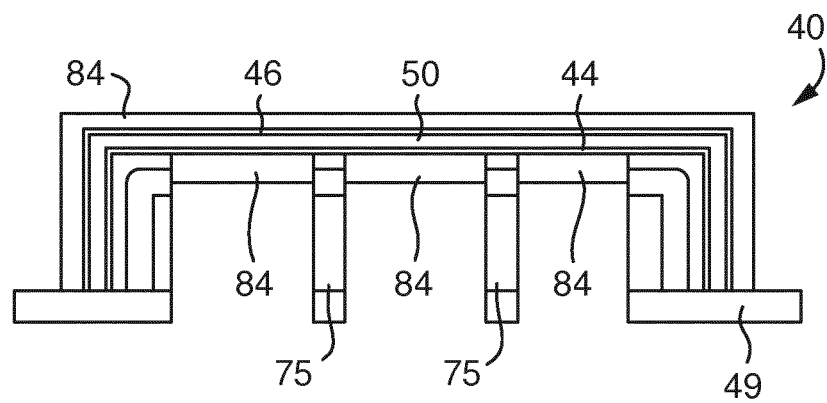

As depicted in FIG. 19, when the mechanical protection material 66 is removed, the etch stop layer 84 remains in place. In an embodiment, an oxidizing plasma is used as the etchant to remove the mechanical protection material 66. Accordingly, the etch stop layer 84 is resistant to oxidizing plasma. In an embodiment the etch stop layer 84 has a thickness in the region of from about 10 nm to about 100 nm. In an embodiment the material used for the etch stop layer 84 is an oxide, which cannot be further oxidized by the oxidizing plasma used to remove the mechanical protection material 66. For example, in an embodiment the etch stop layer 84 comprises an oxide of silicon.

The etch stop layer 84 can then be removed after the step of removing the mechanical protection material 66. Accordingly, by providing the etch stop layer 84, a wet etchant can be used in conjunction with the mechanical protection material 66, while reducing the possibility of the membrane becoming oxidized when the mechanical protection material 66 is removed. Accordingly, an embodiment of the invention is expected to achieve an increase in the uniformity of the membrane of the membrane assembly 80.

FIGS. 20 to 27 schematically depict steps of a method for manufacturing the membrane assembly 80 according to an embodiment of the invention. The method depicted in FIGS. 20 to 27 does not require any mechanical protection material 66 to be used. Accordingly, the method avoids any step of removing the mechanical protection material 66, which could otherwise damage the membrane.

Figure 20:
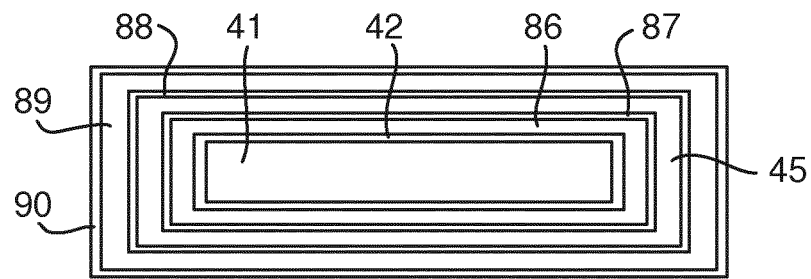
FIGS. 20 to 27 schematically depict stages of a method for manufacturing a pellicle according to an embodiment of the invention.

As depicted in FIG. 20, in an embodiment the stack 40 comprises the planar substrate 41 and the oxidation layer 42. The oxidation layer 42 is for stopping the wet etching process that is used to selectively use parts of the planar substrate 41.

As depicted in FIG. 20, in an embodiment the stack 40 comprises a lower thick etch barrier 86 and a lower thin etch barrier 87. The lower thick etch barrier 86 and the lower thin etch barrier 87 are deposited between the at least one membrane layer 45 and the oxidation layer 42 of the planar substrate 41. The lower thick etch barrier 86 is deposited between the lower thin etch barrier 87 and the oxidation layer 42.

An upper thin etch barrier 88 and an upper thick etch barrier 89 are provided to the stack 40 outside of the at least one membrane layer 45. The material used for the upper thick etch barrier 89 is the same as the material used for the lower thick etch barrier 86. The material used for the upper thin etch barrier 88 is the same as the material used for the lower thin etch barrier 87.

Outside of the upper thick etch barrier 89, the stack 40 is provided with a wet-etching barrier 90. The wet-etching barrier is for protecting the stack 40 from the wet etchant used to selectively remove parts of the planar substrate 41.

Figure 21:
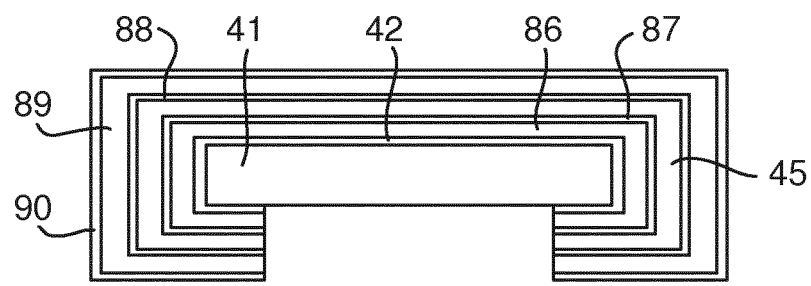

As depicted in FIG. 21, in an embodiment the method comprises a step of selectively removing parts of the wet-etching barrier 90, the upper thick etch barrier 89, the upper thin etch barrier 88, the at least one membrane layer 45, the lower thin etch barrier 87, the lower thick etch barrier 86 and the oxidation layer 42. In an embodiment, this etching process is performed by a dry etching technique. A mask may be used to remove the layers selectively. By performing the dry etching process, the desired portion of the planar substrate 41 is exposed at the bottom of the stack 40.

Figure 22:
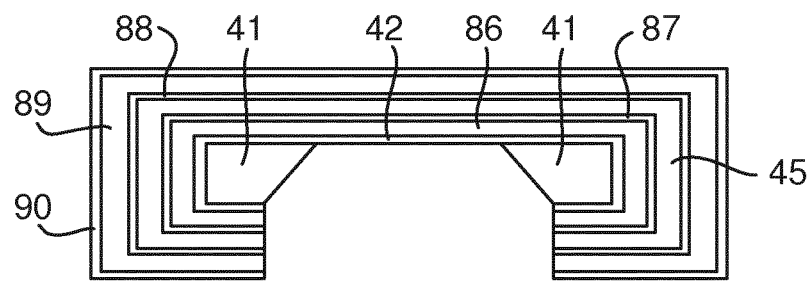

As depicted in FIG. 22, in an embodiment the method comprises selectively removing the inner region of the planar substrate 41. The selective removal of parts of the planar substrate 41 may be performed using a wet etching process. For example a wet etchant such as KOH may be used. The oxidation layer 42 between the membrane and the planar substrate 41 stops the wet etching process from reaching the membrane.

Figure 23:
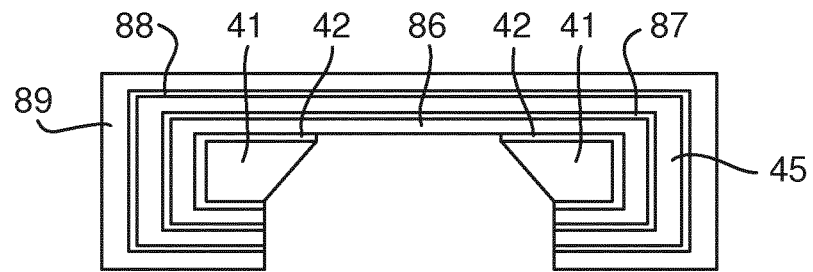
Figure 24:
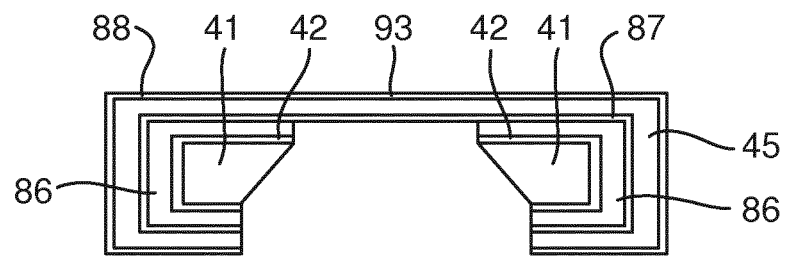

As depicted in FIG. 23, in an embodiment the method comprises selectively removing the oxidation layer 42 that acted as a barrier for the wet etchant. The oxidation layer 42 may be removed by a dry etching technique, for example. As depicted in FIG. 24, in an embodiment the method comprises selectively removing the lower thick etch barrier 86. The lower thick etch barrier 86 may be set to be removed by a dry etching technique. In an embodiment the lower thick etch barrier 86 and the upper thick etch barrier 89 comprise a silicon nitride. In an embodiment the lower thin etch barrier and the upper thin etch barrier comprise a silicon nitride. As depicted in FIG. 24, the upper thick etch barrier 89 may be removed at the same time as the lower thick etch barrier 86 is removed.

Figure 25:
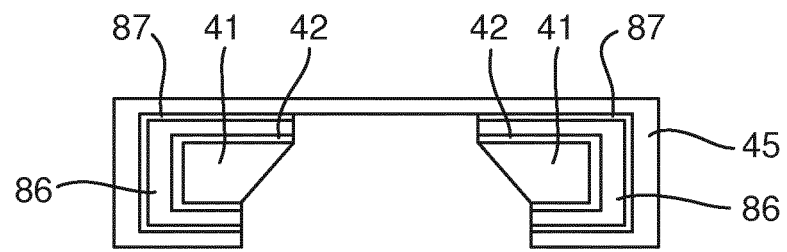

As depicted in FIG. 25, in an embodiment the method comprises removing the lower thin etch barrier 87 and the upper thin etch barrier 88. The lower thin etch barrier 87 and the upper thin etch barrier 88 may be removed substantially simultaneously. A dry etching technique may be used.

Figure 26:
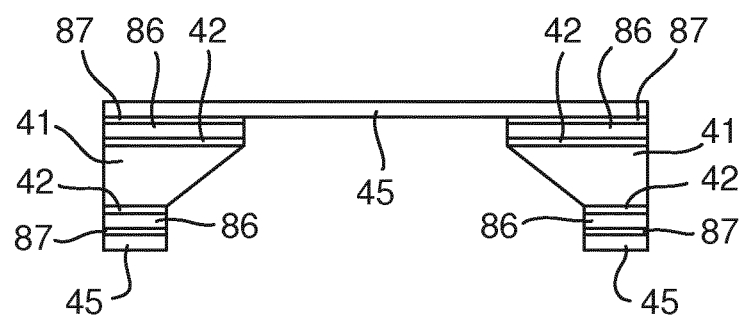

As depicted in FIG. 26, in an embodiment the method comprises separating the membrane from the peripheral sections of the at least one membrane layer 45 that are to be discarded (rather than form part of the membrane). In an embodiment the separation is performed by a laser dicing process. Accordingly, the membrane is extended across the remaining parts of the stack 40, which form the order of the membrane assembly 80.

Figure 27:
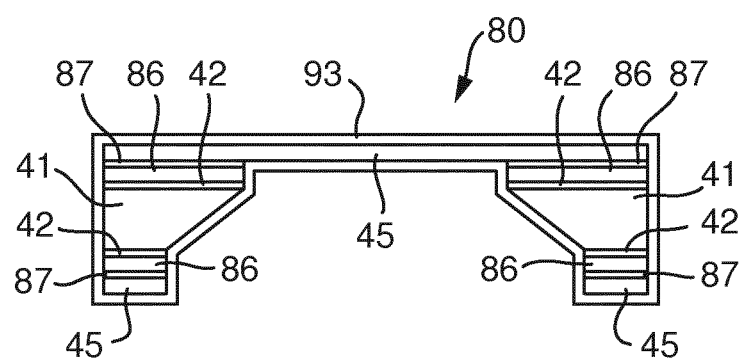

As depicted in FIG. 27, in an embodiment the method comprises providing a capping layer 93 to the membrane assembly 80. In an embodiment the capping layer 93 is provided all around the membrane assembly 80. In an embodiment the capping layer 93 is made of the same material as the lower capping film 44 or the upper capping film 46 described in relation to other embodiments.

As shown in FIGS. 21 and 22, when the stack 40 undergoes the wet etching process, the at least one membrane layer 45 is supported on the upper and lower sides by the lower thick edge barrier 86 and the upper thick etch barrier 89. Accordingly, the lower thick etch barrier 86 and the upper thick etch barrier 89 provide mechanical support to the at least one membrane layer 45. This allows the stack 40 to be handled by tools with a reduced possibility of the membrane breaking during the manufacturing process. For example, the stack 40 can be placed into a bath of wet etchant and removed from the bath of wet etchant with a reduced possibility of the membrane failing or breaking.

Accordingly, by providing the lower thick etch barrier 86 and the upper thick etch barrier 87, it is not necessary to provide any further mechanical protection material 66 that would subsequently need to be removed. Accordingly, an embodiment of the invention is expected to make it easier to manufacture a membrane assembly 80, with a reduced possibility of the membrane breaking during manufacture and a reduced possibility of the membrane becoming oxidized during manufacture.

Figure 28:
FIGS. 28 to 35 schematically depict stages of a method for manufacturing a pellicle according to an embodiment of the invention.

FIGS. 28 to 35 depict steps of an alternative embodiment of the invention, which also avoids the necessity for any mechanical protection material 66 being applied and removed from the stack 40. As depicted in FIG. 28, in an embodiment the stack comprises the planar substrate 41, a silicon nitride layer 91, the lower thick etch barrier 86, the lower thin etch barrier 87, the at least one membrane layer 45, the upper thin etch barrier 88 and the upper thick etch barrier 89. However, the stack 40 does not require the outer wet etching barrier 90.

Figure 29:
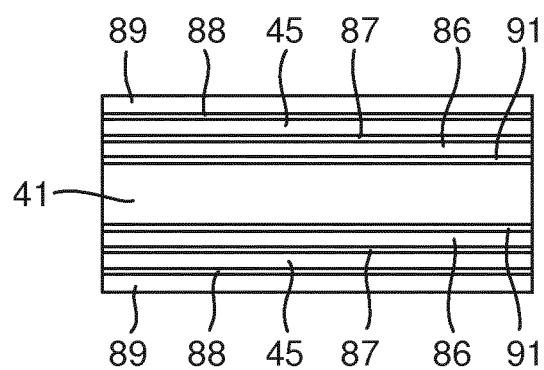

As depicted in FIG. 29, in an embodiment the method comprises cutting the stack 40 so as to provide a stack 40 having the desired shape of the membrane assembly 80. For example, in an embodiment the stack 40 is laser diced into a rectangular shape. This means that it is not necessary to perform any dicing step or breaking step later on in the method which could otherwise result in the creation of contaminant particles that stick to the membrane. Contaminant particles that are produced from any dicing step early on in the method can be more easily cleaned away without the contaminant particles adhering to the membrane.

Figure 30:
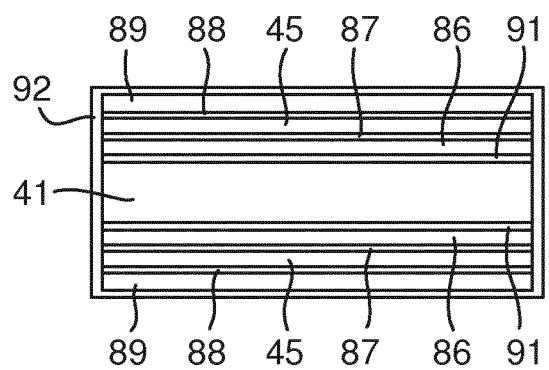

As depicted in FIG. 30, in an embodiment the method comprises applying an outer sacrificial layer 92 to the stack 40. In an embodiment the outer sacrificial layer 92 comprises a silicon nitride. The outer sacrificial layer 92 is for protecting the stack 40 from the wet etchant used to selectively remove parts of the planar substrate 41.

Figure 31:
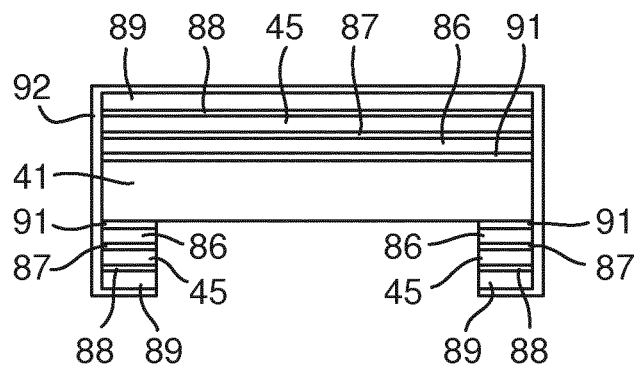
Figure 32:
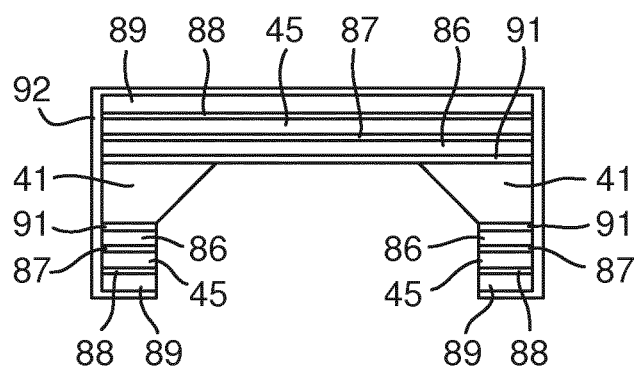

As depicted in FIG. 31, in an embodiment the method comprises the steps of selectively etching the outer sacrificial layer 92, the upper thick etch barrier 89, the upper thin etch barrier 88, the at least one membrane layer 45, the lower thin etch barrier 87, the lower thick etch barrier 86 and the silicon nitride layer 91. As a result, the bottom of the planar substrate 41 is exposed. This allows the planar substrate 41 to be selectively removed by a wet etching process. The wet etchant may be KOH. For example, in an embodiment the stack 40 is placed into a bath of KOH and subsequently removed from the bath of KOH using a handling tool. The presence of the lower thick etch barrier 86 and the upper thick etch barrier 89 mechanically supports the at least one membrane layer 45 so that the membrane is less likely to be damaged during the process of etching the planar substrate 41.

Figure 33:
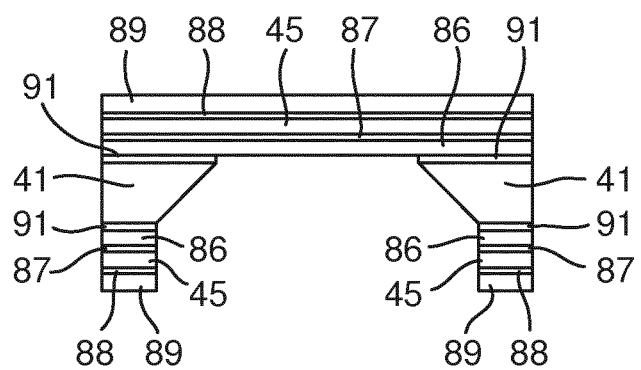

As depicted in FIG. 33, in an embodiment the method comprises etching the outer sacrificial layer 92 and the silicon nitride layer 91. Alternatively, instead of the silicon nitride layer 91, an oxidation layer 42 of the planar substrate 41 may be provided. The outer sacrificial layer 92 and the silicon nitride layer 91 may be removed substantially simultaneously using a dry etching process.

Figure 34:
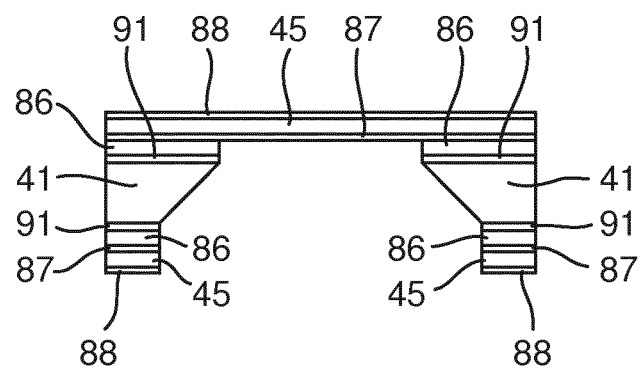
Figure 35:
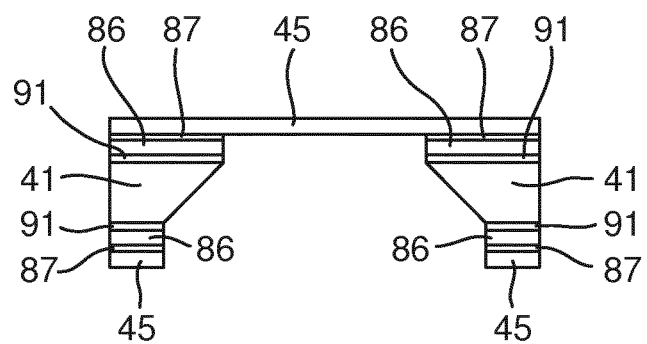

As depicted in FIG. 34, in an embodiment the method comprises selectively removing the upper thick etch barrier 89 and the lower thick etch barrier 86. These may be removed using a dry etching process. As depicted in FIG. 35, in an embodiment the method comprises removing the lower thin etch barrier 87 and the upper thin etch barrier 88. This exposes the membrane at that top and bottom of the stack 40. In an embodiment the method further comprises applying the capping layer 93 to the outside of the membrane assembly 80 so as to provide a protective layer to the membrane, as depicted in FIG. 27.

As depicted in FIG. 8, in an embodiment, a suction (flow) is applied during the edge breaking step. When the membrane is separated away from the parts of the at least one membrane layer 50 that are to be discarded, suction is applied locally. The suction is applied in order to remove any contaminant particles that are created during the separation step. As depicted in FIG. 8, in an embodiment a suction device 85 applies a suction pressure to the region where the separation is formed.

The suction device 85 reduces the possibility of contaminant particles adhering to the membrane of the membrane assembly 80. In an embodiment the suction device 85 is simultaneously applied to all of the regions where the separation is taking place. For example, the suction device 85 may take the form of a rectangular shape that corresponds to the shape of the membrane assembly 80. Alternatively, in an embodiment the suction device 85 is moved during the separating step so as to be adjacent to wherever the at least one membrane layer 50 is being broken.

In an embodiment, the membrane assembly 80 can be used as a pellicle placed in front of the patterning device MA and thus protect the patterning device MA. An embodiment of the invention is expected to achieve a reduction of fragility of a pellicle. An embodiment of the invention is expected to make it easier to produce membrane assemblies in high volume. An embodiment of the invention is expected to enable the processing of a free standing membrane integrated in a frame.

In an embodiment the membrane assembly 80 is configured to transmit at least 90% of radiation having a wavelength of 13.5 nm. In an embodiment the membrane assembly 80 is configured to transmit less than 5% of DUV radiation (approximately 100-400 nm).

In an embodiment the membrane layer 50 of the membrane assembly 80 comprises silicon. Silicon is one of the most transparent elements to EUV radiation. Silicon is a commonly processed and available material. In an embodiment the membrane layer 50 is capped with Ru, Zr, Mo, a silicon oxide, a zirconium oxide, an aluminum oxide, boron nitride, a ruthenium oxide, a ruthenium nitride, a zirconium nitride, a molybdenum oxide or a molybdenum nitride. Such a combination is expected to reduce hydrogen-induced outgassing and the consequent redeposition of silicon. Also using a cap layer comprising tungsten, lead titanate, barium titanate, silicon carbide or molybdenum disilicide may increase the thermal emissivity of the membrane. The membrane assembly 80 may be used in an environment that contains hydrogen radicals. Tungsten is for example a material which can withstand hydrogen plasma and it is also reasonably stable against oxidation up to 400° C. Tungsten has also a high melting point (3422° C.) and it has a low coefficient of thermal expansion compared to other metals.

In an embodiment the membrane assembly 80 is applied as a pellicle or as part of a dynamic gas lock. Alternatively, the membrane assembly 80 can be applied in other filtration areas such as identification, or for beam splitters.

There are provided embodiments according to the following clauses:

1. A method for manufacturing a membrane assembly for EUV lithography, the method comprising:
   providing a stack comprising a planar substrate and at least one membrane layer, wherein the planar substrate comprises an inner region, a border region around the inner region, a bridge region around the border region and an edge region around the bridge region;
   forming a bridge groove through the at least one membrane layer adjacent the bridge region of the planar substrate;
   selectively removing the inner region and the bridge region of the planar substrate, such that the membrane assembly comprises:
   a membrane formed from the at least one membrane layer;
   a border holding the membrane, the border formed from the border region of the planar substrate;
   an edge section around the border, the edge section formed from the edge region of the planar substrate; and
   a bridge between the border and the edge section, the bridge formed by the at least one membrane layer; and
   separating the edge section from the border such that the at least one membrane layer adjacent the edge section is separated from the membrane by the bridge groove.

2. The method of clause 1, comprising positioning the stack on a support such that the inner region of the planar substrate is exposed, wherein the inner region of the planar substrate is selectively removed when the stack is on the support using a non-liquid etchant.

3. The method of clause 2, wherein the inner region of the planar substrate is selectively removed by atomic layer etching, sputter etching, plasma etching, reactive-ion etching or deep reactive-ion etching.

4. The method of clause 1, wherein:
   the stack is provided with a mechanical protection material configured to mechanically protect the border region during the step of selectively removing the inner region of the planar substrate; and
   the mechanical protection material is removed using a fluoride etchant.

5. The method of clause 4, wherein the fluoride etchant comprises a $XeF_2$ plasma.

6. A method for manufacturing a membrane assembly for EUV lithography, the method comprising:
   providing a stack comprising a planar substrate and at least one membrane layer, wherein the planar substrate comprises an inner region and a border region around the inner region;
   positioning the stack on a support such that the inner region of the planar substrate is exposed; and
   selectively removing the inner region of the planar substrate using a non-liquid etchant, such that the membrane assembly comprises:
   a membrane formed from the at least one membrane layer; and
   a border holding the membrane, the border formed from the border region of the planar substrate.

7. The method of clause 6, wherein the inner region of the planar substrate is selectively removed by atomic layer etching, sputter etching, plasma etching, reactive-ion etching or deep reactive-ion etching.

8. A method for manufacturing a membrane assembly for EUV lithography, the method comprising:
   providing a stack comprising a planar substrate and at least one membrane layer, wherein the planar substrate comprises an inner region and a border region around the inner region; and
   selectively removing the inner region of the planar substrate, such that the membrane assembly comprises:
   a membrane formed from the at least one membrane layer; and a border holding the membrane, the border formed from the border region of the planar substrate, wherein the stack is provided with a mechanical protection material configured to mechanically protect the border region during the step of selectively removing the inner region of the planar substrate; and removing the mechanical protection material using a fluoride etchant.

9. The method of clause 8, wherein the fluoride etchant comprises a $XeF_2$ plasma.

10. The method of any preceding clause, wherein the stack is rectangular.

11. The method of clause 10, wherein edges of the at least one membrane layer in the stack are rounded or chamfered.

12. The method of any of clauses 6 to 11, wherein:

the planar substrate comprises a bridge region around the border region and an edge region around the bridge region;

a bridge groove is formed through the at least one membrane layer adjacent the bridge region of the planar substrate;

the membrane assembly comprises:

an edge section around the border, the edge section formed from the edge region of the planar substrate; and a bridge between the border and the edge section, the bridge formed by the at least one membrane layer; and the edge section is separated from the border such that the at least one membrane layer adjacent the edge section is separated from the membrane by the bridge groove.

13. The method of any of clauses 1 to 5 and 12, wherein the bridge groove is formed by cutting through the at least one membrane layer using a laser or EUV radiation.

14. The method of any of clauses 1 to 5, 12 and 13, wherein the bridge groove is formed such that part of the at least one membrane layer extends radially outwardly of the border region of the planar substrate, such that when the edge section is separated from the border, said part of the at least one membrane layer extends radially outwardly of the border.

15. The method of any of clauses 1 to 5 and 12 to 14, comprising applying a passivation coating to the edges of the at least one membrane layer after separating the edge section from the border.

16. The method of clause 15, wherein the passivation coating is applied using atomic layer deposition, chemical vapor deposition, electroplating or dip coating.

17. The method of any of clauses 15 and 16, wherein the passivation coating comprises one or more selected from: a metal, a silicide, an oxide or a nitride.

18. The method of clause 15, wherein the passivation coating is applied using physical vapor deposition, wherein a shadow mask is used such that only the edges of the at least one membrane layer receive the passivation coating.

19. The method of any preceding clause, wherein the at least one membrane layer comprises an amorphous material.

20. The method of any preceding clause, comprising oxidizing or nitriding the edges of the at least one membrane layer after separating the edge section from the border.

21. The method of any preceding clause, wherein the stack is provided with an intermediate layer between the planar substrate and the at least one membrane layer, the method comprising isotropically etching the intermediate layer after the step of selectively removing the inner region of the planar substrate.

22. The method of any preceding clause, comprising changing a pre-tension in the at least one membrane layer of the stack by one or more selected from: an annealing process, ion beam modification, controlling a pressure applied to the stack, or controlling a temperature applied to the stack.

23. The method of any preceding clause, wherein the membrane assembly is for a patterning device or a dynamic gas lock.

24. The method of any preceding clause, wherein at least one membrane layer of the stack is a layer comprising tungsten, lead titanate, barium titanate, silicon carbide or molybdenum disilicide.

25. A membrane assembly for EUV lithography, the membrane assembly comprising a membrane formed from at least one membrane layer comprising silicon and a border holding the membrane, wherein:

edges of the at least one membrane layer in the stack are rounded or chamfered; and/or part of the at least one membrane layer extends radially outwardly of the border; and/or a passivation coating is applied to the edges of the at least one membrane layer; and/or the edges of the at least one membrane layer are oxidized or nitride.

26. The membrane assembly of clause 25, wherein when the passivation coating is applied to the edges of the at least one membrane layer, the passivation coating comprises Ru.

27. The membrane assembly of clause 25 or clause 26, wherein the membrane assembly is for a patterning device or a dynamic gas lock.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. For example, the various lacquer layers may be replaced by non-lacquer layers that perform the same function.

The descriptions above are intended to be illustrative, not limiting. Thus it will be apparent to one skilled in the art that modifications may be made to the invention as described without departing from the scope of the claims set out below.

The invention claimed is:

1. A method for manufacturing a membrane assembly for EUV lithography, the method comprising:

providing a stack comprising a planar substrate and at least one membrane layer, wherein the planar substrate comprises an inner region, a border region around the inner region, a bridge region around the border region and an edge region around the bridge region;

forming a bridge groove through the at least one membrane layer adjacent the bridge region of the planar substrate;

selectively removing the inner region and the bridge region of the planar substrate, such that the membrane assembly comprises:

a membrane formed from the at least one membrane layer, a border holding the membrane, the border formed from the border region of the planar substrate, an edge section around the border, the edge section formed from the edge region of the planar substrate, and a bridge between the border and the edge section, the bridge formed by the at least one membrane layer; and separating the edge section from the border such that the at least one membrane layer adjacent the edge section is separated from the membrane by the bridge groove.

2. The method of claim 1, comprising positioning the stack on a support such that the inner region of the planar substrate is exposed, wherein the inner region of the planar substrate is selectively removed, when the stack is on the support, using a non-liquid etchant.

3. The method of claim 2, wherein the inner region of the planar substrate is selectively removed by atomic layer etching, sputter etching, plasma etching, reactive-ion etching or deep reactive-ion etching.

4. The method of claim 1, wherein:
the stack is provided with a mechanical protection material configured to mechanically protect the border region during the step of selectively removing the inner region of the planar substrate; and
the mechanical protection material is removed using a fluoride etchant.

5. The method of claim 1, wherein the stack is rectangular.

6. The method of claim 1, wherein the bridge groove is formed by cutting through the at least one membrane layer using a laser or EUV radiation.

7. The method of claim 1, wherein the bridge groove is formed such that part of the at least one membrane layer extends radially outwardly of the border region of the planar substrate, such that when the edge section is separated from the border, the part of the at least one membrane layer extends radially outwardly of the border.

8. The method of claim 1, comprising applying a passivation coating to the edges of the at least one membrane layer after separating the edge section from the border.

9. The method of claim 8, wherein the passivation coating comprises one or more selected from: a metal, a silicide, an oxide or a nitride.

10. The method of claim 8, wherein the passivation coating is applied using physical vapour deposition, and wherein a shadow mask is used such that only the edges of the at least one membrane layer receive the passivation coating.

11. The method of claim 1, wherein the at least one membrane layer comprises an amorphous material.

12. The method of claim 1, comprising oxidizing or nitriding the edges of the at least one membrane layer after separating the edge section from the border.

13. The method of claim 1, wherein the stack is provided with an intermediate layer between the planar substrate and the at least one membrane layer, the method comprising isotropically etching the intermediate layer after the step of selectively removing the inner region of the planar substrate.

14. The method of claim 1, comprising changing a pre-tension in the at least one membrane layer of the stack by one or more selected from: an annealing process, ion beam modification, controlling a pressure applied to the stack, or controlling a temperature applied to the stack.

15. The method of claim 1, wherein at least one membrane layer of the stack is a layer comprising tungsten, lead titanate, barium titanate, silicon carbide or molybdenum disilicide.

16. A method for manufacturing a membrane assembly for EUV lithography, the method comprising:
providing a stack comprising a planar substrate and at least one membrane layer, wherein the planar substrate comprises an inner region and a border region around the inner region;
positioning the stack on a support such that the inner region of the planar substrate is exposed;
selectively removing the inner region of the planar substrate using a non-liquid etchant, such that the membrane assembly comprises:
a membrane formed from the at least one membrane layer, and
a border holding the membrane, the border formed from the border region of the planar substrate; and
after the selective removal of the inner region of the planar substrate, separating off a portion of the planar substrate to form the border.

17. The method of claim 16, wherein:
the planar substrate comprises a bridge region around the border region and an edge region around the bridge region;
a bridge groove is formed through the at least one membrane layer adjacent the bridge region of the planar substrate; and
the membrane assembly comprises:
an edge section around the border, the edge section formed from the edge region of the planar substrate, and
a bridge between the border and the edge section, the bridge formed by the at least one membrane layer; and
the separating off the portion of the substrate comprises separation of the edge section from the border such that the at least one membrane layer adjacent the edge section is separated from the membrane by the bridge groove.

18. A method for manufacturing a membrane assembly for EUV lithography, the method comprising:
providing a stack comprising a planar substrate and at least one membrane layer, wherein the planar substrate comprises an inner region and a border region around the inner region; and
selectively removing the inner region of the planar substrate, such that the membrane assembly comprises:
a membrane formed from the at least one membrane layer, and
a border holding the membrane, the border formed from the border region of the planar substrate,
wherein the stack is provided with a mechanical protection material configured to mechanically protect the border region during the step of selectively removing the inner region of the planar substrate; and
removing essentially of the mechanical protection material using a fluoride etchant.

19. A membrane assembly for EUV lithography, the membrane assembly comprising a membrane formed from at least one membrane layer comprising silicon and a border holding the membrane, wherein:
edges of the at least one membrane layer in the stack are rounded or chamfered, at least one of the edges defining the intersection between a major surface of the membrane layer and a minor side surface of the membrane layer and rounding or chamfering of the at least one edge extending from the major surface toward the minor side surface; and/or part of the at least one membrane layer extends radially outwardly of the border; and/or a passivation coating is applied to the edges of the at least one membrane layer; and/or the edges of the at least one membrane layer are oxidized or nitrided.

20. The membrane assembly of claim 19, wherein when the passivation coating is applied to the edges of the at least one membrane layer, the passivation coating comprises Ru.

21. The membrane assembly of claim 19, wherein the membrane assembly is for a patterning device or a dynamic gas lock.

* * * * *